US012604624B2

(12) United States Patent
Wang et al.

(10) Patent No.: US 12,604,624 B2
(45) Date of Patent: Apr. 14, 2026

(54) DISPLAY PANEL AND DISPLAY APPARATUS WITH ARRANGEMENT FOR CONNECTING LINE

(71) Applicant: WUHAN TIANMA MICROELECTRONICS CO., LTD., Wuhan (CN)

(72) Inventors: Lei Wang, Wuhan (CN); Yangzhao Ma, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 756 days.

(21) Appl. No.: 18/045,207

(22) Filed: Oct. 10, 2022

(65) Prior Publication Data

US 2023/0110850 A1 Apr. 13, 2023

(30) Foreign Application Priority Data

Jun. 23, 2022 (CN) .......................... 202210724320.6

(51) Int. Cl.
*H10K 59/131* (2023.01)
*H10K 59/88* (2023.01)
(52) U.S. Cl.
CPC ........... *H10K 59/131* (2023.02); *H10K 59/88* (2023.02)
(58) Field of Classification Search
CPC ........ H10K 59/131; H10K 59/88; G09F 9/30; G09G 3/20
USPC ........................................................ 257/72
See application file for complete search history.

(56) References Cited

U.S. PATENT DOCUMENTS

| | | | | |
|---|---|---|---|---|
| 10,732,752 | B1 * | 8/2020 | Zhu | G06F 3/0416 |
| 2019/0237487 | A1 * | 8/2019 | Zhang | G02F 1/1345 |
| 2022/0019328 | A1 * | 1/2022 | Li | G06F 3/0443 |
| 2022/0320237 | A1 * | 10/2022 | Liu | G06F 3/0412 |

(Continued)

FOREIGN PATENT DOCUMENTS

| | | | | | |
|---|---|---|---|---|---|
| CN | 109445210 | A | * | 3/2019 | ....... G02F 1/136286 |
| CN | 112198990 | A | | 1/2021 | |

(Continued)

OTHER PUBLICATIONS

First Chinese Office Action mailed on May 6, 2025, issued in Chinese Application No. 202210724320.6, filed Jun. 23, 2022; 18 pages.

*Primary Examiner* — Mohammad M Hoque
(74) *Attorney, Agent, or Firm* — CHRISTENSEN O'CONNOR JOHNSON KINDNESS PLLC

(57) ABSTRACT

A display panel and a display apparatus are provided. The display panel includes a plurality of data lines each and a plurality of connecting lines that are located in a display area, and a plurality of pads located in a non-display area. Each of the plurality of data lines extends in a first direction. Each of the plurality of connecting lines has a first end connected with one of the plurality of data lines, and a second end connected with one of the plurality of pads. The display area includes a first boundary close to the pads. The connecting line includes a first segment extending from the first boundary into the display area in the first direction. At least one connecting line has a length $D_1$ in the first direction, and the display area has a length $D_0$ in the first direction. $D_1$ is greater than $D_0/2$.

22 Claims, 16 Drawing Sheets

(56)  References Cited

U.S. PATENT DOCUMENTS

2023/0043145 A1 *  2/2023  Yuan ................... G09G 3/3258
2023/0352391 A1 *  11/2023  Mi ................... H01L 23/49838

FOREIGN PATENT DOCUMENTS

CN         113031352 A  *  6/2021  ......... G02F 1/13452
CN         113345931 A      9/2021
CN         113964142 A  *  1/2022  ............ H10D 86/60
CN         114335074 A      4/2022
KR         102037053 B1 *  10/2019  ....... G02F 1/136286

* cited by examiner

DISPLAY PANEL AND DISPLAY APPARATUS WITH ARRANGEMENT FOR CONNECTING LINE

CROSS-REFERENCE TO RELATED APPLICATIONS

The present application claims to the benefit of Chinese Patent Application No. 202210724320.6, filed on Jun. 23, 2022, the content of which is incorporated herein by reference in its entirety.

TECHNICAL FIELD

The disclosure relates to a technical field of displaying, in particular to a display panel and a display apparatus.

BACKGROUND

Conventionally, a lower frame of a display panel is provided with a fan-out line, one end of the fan-out line is connected with a display driving chip and the other end of the fan-out line is connected with a data line located in a display area. However, the fan-out line consumes a large space in the lower frame, which leads to a large width of the lower frame and affects appearance. A current design scheme is to dispose some of fan-out lines in the display area to reduce the width of the lower frame. However, if some of the fan-out lines are disposed in the display area, the fan-out lines in the display area may reflect ambient light, which results in differences in reflectivities to the ambient light between the display area where the fan-out lines are located and other display areas with no fan-out lines provided, and thus a problem of picture non-uniformity in an always on display (AOD) state.

SUMMARY

A display panel and a display apparatus are provided in embodiments of the disclosure to solve a problem of picture non-uniformity in an always on display (AOD) of conventional displays.

In a first aspect, a display panel is provided. In an embodiment, the display panel includes a display area and a non-display area.

In an embodiment, the display panel includes a plurality of data lines and a plurality of connecting lines that are located in the display area, and a plurality of pads located in the non-display area. In an embodiment, the plurality of data lines each extends in a first direction. In an embodiment, each of the plurality of connecting lines has a first end connected with one of the plurality of data lines, and a second end connected with one of the plurality of pads. In an embodiment, the display area includes a first boundary close to the pads.

In an embodiment, the connecting line includes a first segment. In an embodiment, the first segment extends from the first boundary into the display area in the first direction.

In an embodiment, a length of a first segment in at least one of the plurality of connecting lines in the first direction is $D_1$, and a length of the display area in the first direction is $D_0$. $D_1$ is greater than $D_0/2$.

In a second aspect, a display apparatus is provided, which includes the display panel according to any of embodiments of the present disclosure.

In an embodiment, the display panel and the display apparatus according to embodiments of the disclosure have following beneficial effects. In an embodiment, the connecting lines are arranged in the display area, at least one of the data lines is connected with respective pads through the connecting lines, and at least one of the fan-out lines is disposed in the display area, so that a wiring space in the non-display area can be saved, and narrowing of the non-display area can be facilitated. In an embodiment, the connecting lines are stretched in an extending direction of the data line, so that at least one of the connecting lines extend from a lower display area to an upper display area in the display area, and thus the connecting lines are arranged in the extending direction of the data line in the display area. In this way, sharp change of pattern density of the connecting lines in the first direction in the display area can be avoided, differences in reflectivities to the ambient light between the upper display area and the lower display area in the display area can be reduced, and the problem of picture non-uniformity in an AOD state can be addressed.

BRIEF DESCRIPTION OF DRAWINGS

In order to explain technical solutions in embodiments of the present disclosure or in the related art more clearly, the drawings used in the embodiments and in the related art will be briefly introduced below. Obviously, the drawings in the following description are intended to be some of the embodiments of the present disclosure, and other drawings can be obtained for those of skilled in the art according to these drawings without paying creative efforts.

DESCRIPTION OF EMBODIMENTS

In order to make purposes, technical schemes and advantages of embodiments of the present disclosure more clear, technical schemes in the embodiments of the present disclosure will be clearly and completely described below with reference to the drawings in the embodiments of the present disclosure. Obviously, the described embodiments are a part of the embodiments of the present disclosure, but not all of them. On a basis of the embodiments in this disclosure, all other embodiments obtained by the ordinary skilled in the art without paying creative effort are within a protection scope of this disclosure.

Terms used in the embodiments of the present disclosure are only for the purpose of describing specific embodiments, but not intended to limit the present disclosure. Singular forms of "a", "said" and "the" used in the embodiments of the present disclosure and the appended claims are also intended to include a plural form, unless the context clearly indicates other meaning otherwise.

Figure 1:
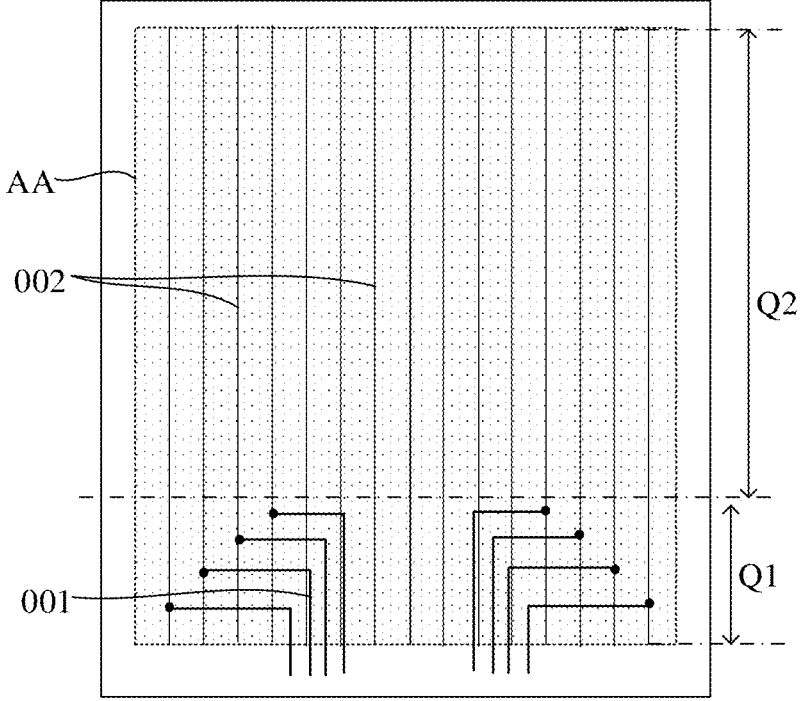
FIG. 1 is a schematic diagram of a conventional display panel.

A fan-out line is provided in a non-display area of a conventional display panel, and the fan-out line is a connecting line for connecting a data line in a display area with a driving chip in the non-display area. Because a pitch of the data lines in the display area is larger than a pitch between adjacent pins on the driver chip, and in order to realize connection between the data lines in the display area and respective pins of the driver chip, fan-out lines are provided in the non-display area, and a pitch between fan-out lines is gradually reduced in a direction from the display area to the driver chip. That is to say, a plurality of fan-out lines is led out from the display area, gradually aggregated and converged, and then connected to respective pads, in which a certain space is consumed by aggregating and converging of the fan-out lines. In order to reduce the space consumed by fan-out lines in the non-display area, some of the fan-out lines are arranged in the display area in the related art. FIG. 1 is a schematic diagram of a display panel in the related art. As shown in FIG. 1, fan-out lines 001 in the display area AA are connected with data lines 002, while fan-out lines 001 in a display area AA are basically connected with respective data lines 002 at a lower part of the display area AA, resulting in the display area AA being divided into two areas, upper and lower areas. There are patterned fan-out lines 001 in a first area Q1, but no fan-out line 001 in the second area Q2, which leads to a large difference in pattern density between the two areas. However, the patterned fan-out lines 001 in the display area AA has a certain reflection to the ambient light, which results in large differences in reflectivities to the ambient light between an area in the display area AA where the fan-out lines 001 are located and other display areas with no fan-out lines 001 provided, and thus a problem of picture non-uniformity in an always on display state.

In order to solve problems existing in the related art, a display panel is provided in an embodiment of the present disclosure, in which connecting lines (also be referred to as fan-out lines located in the display area) are arranged in the display area, at least one of data lines is connected with respective pads through the connecting lines, and the connecting lines are stretched in an extending direction of the data lines, so that at least one of the connecting lines is stretched beyond a lateral center line of the display area, or at least one of the connecting lines is stretched from the lower display area to the upper display area in the display area, so that the connecting lines are arranged at a plurality of positions in the extension direction of the data lines in the display area. In this way, sharp change of the pattern density of the connecting lines in the display area can be avoided, differences in reflectivities to the ambient light between different positions in the display area can be reduced, and the problem of picture non-uniformity in an always on display state can be addressed.

Figure 2:
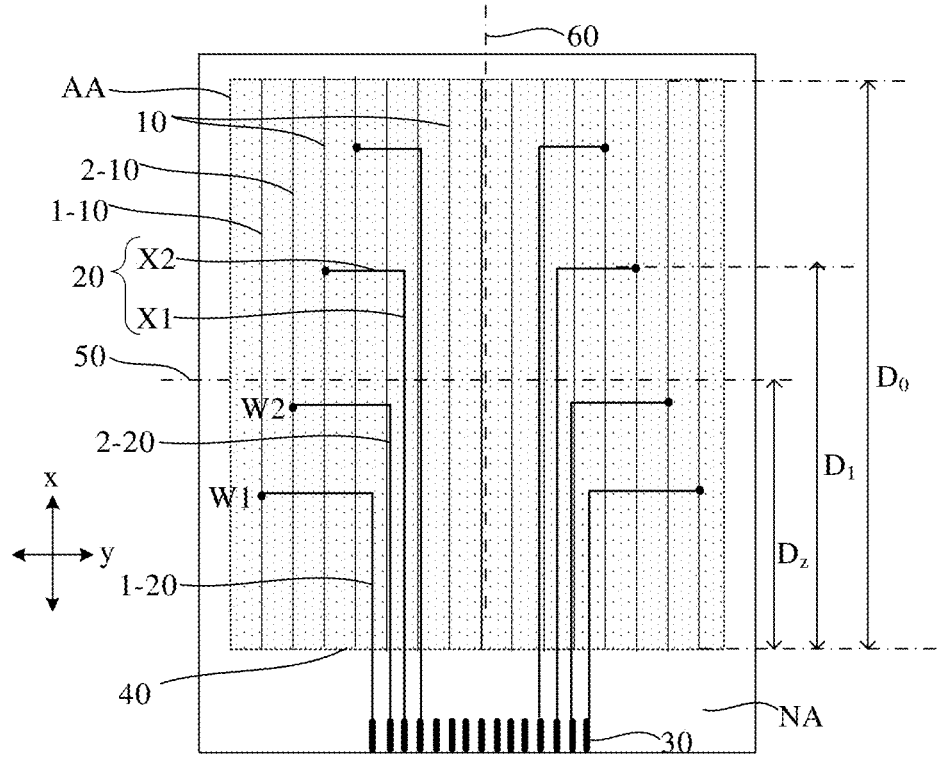
FIG. 2 is a schematic diagram of a display panel according to an embodiment of the present disclosure.

FIG. 2 is a schematic diagram of a display panel according to an embodiment of the present disclosure. As shown in FIG. 2, the display panel has a display area AA and a non-display area NA. The display panel includes a plurality of data lines 10 and a plurality of connecting lines 20 that are in the display area AA, and a plurality of pads 30 in the non-display area NA. Each of the data lines 10 extends in a first direction x. A first end of each of the connecting lines 20 is connected with the data line 10, and a second end of the connecting line 20 is connected with a respective one of the pads 30. The pad 30 is configured for binding connection of the connecting line 20 and a driving structure. The driving structure can be a driving chip or a flexible printed circuit board on which the driving chip is fixed.

The display area AA has a first boundary 40 at a side of the display area AA close to the pads 30. The first boundary 40 is a boundary between the display area AA and the non-display area AA close to the pad 30. The connecting line 20 includes a first segment X1. In the first direction x, the first segment X1 extends from the first boundary 40 into the display area AA. The first segment X is an initial segment of the connecting line 20 extending in the display area AA from the first boundary 40, and an extending direction of the first segment X1 is the same as that of the data line 10. The first direction x is a wiring direction or extension direction of the first segment X1, which indicates that the first segment X1 has a certain length in the first direction x. In FIG. 2, the first segment X1 is shown as a straight line for illustration. In some embodiments, the first segment X1 may be a broken line composed of a plurality of segments.

A length of the first segment X1 in at least one connecting line of the plurality of connecting lines 20 in the first direction is $D_1$, and a length of the display area in the first direction is $D_0$. $D_1$ is greater than $D_0/2$. That is, a length of the first segment X1 in at least one of the connecting line 20 in the first direction x are not less than half of the length of the display area AA in the first direction x. That is, the first segment X1 of at least one connecting line 20 extends from the first boundary 40 into the display area AA in the first direction x, and extends to a position beyond the lateral center line 50 of the display area AA. The lateral center line 50 divides the display area AA into an upper display area and a lower display area adjacent to each other in the first direction x. The upper display area and the lower display area are symmetrical about the lateral center line 50, and the lower display area is closer to the first boundary 40 than the upper display area, the upper display area is farther away from the first boundary 40 than the lower display area. The lateral center line 50 extends in a second direction y, which intersects with the first direction x. Optionally, the second direction y and the first direction x are perpendicular to each other. In the first direction x, a distance between the lateral center line 50 and the first boundary 40 is $D_z$, where $D_z = D_0/2$.

In the embodiment of the present disclosure, the connecting lines 20 are arranged in the display area AA, at least one of the data lines 10 is connected with respective pads 30 through the connecting lines 20, and at least one of the fan-out lines is disposed in the display area AA, so that a wiring space in the non-display area NA can be saved, and narrowing of the non-display area NA can be facilitated. The connecting lines 20 are stretched in an extending direction of the data line 10, so that at least one of the connecting lines 20 extends from a lower display area to an upper display area in the display area AA, and thus the connecting lines 20 are arranged in the extending direction of the data line 10 and at a plurality of positions in the display area AA. In this way, sharp change of pattern density of the connecting lines 10 in the first direction in the display area AA can be avoided, differences in reflectivities to the ambient light between the upper display area and the lower display area in the display area AA can be reduced, and the problem of picture non-uniformity in an always on display state can be addressed.

In some embodiments, $D_1 > 2D_0/3$. In some embodiments, a longest one of the first segments X1 in the connecting lines 20 basically runs through the display area AA in the first direction x. In other words, the longest one of the first segments X1 in the connecting lines 20 extends to a top of the upper display area of the display area AA in the first direction x, which indicates that the first segment X1 is stretched all over the display area AA in the first direction x, so that there are patterns of the first segments X1 in respective positions in the first direction x in the display area AA. In this way, sharp change of the pattern density of the connecting line 10 in the display area AA in the first direction x can be avoided, differences in reflectivities to the ambient light between the upper display area and the lower display area in the display area AA can be reduced, and the problem of picture non-uniformity in an always on display state can be addressed.

As shown in FIG. 2, the display area AA includes a symmetry axis 60 extending in the first direction x. At a side of the symmetry axis 60: from an edge of the display area AA to the symmetry axis 60 in the second direction y, lengths of the first segments X1 gradually become larger. As shown in FIG. 2, the connecting line 20 further includes a second segment X2 extending in the second direction y, one end of the second segment X2 is connected with the first segment X1, and the other end of the second segment X2 is connected with the data line 10. The connecting line 20 located in the display area AA extends in the display area AA from an initial position, and the initial position is a position of the first boundary 40. The initial position of the connecting line 20 at the first boundary 40 is at a certain distance from the data line 10 to which the connecting line 20 is connected, so the connecting line 20 extends in the first direction x (for example the first segment X1) and then extends in the second direction y (for example the second segment X2), and then connected to the respective data line 10. In an embodiment of the present disclosure, lengths of the first segments X1 at a side of the symmetry axis 60 gradually increase in a direction directing to the symmetry axis 60, so that when the plurality of connecting lines 20 are wired, the connecting lines 20 are not short-circuited due to intersecting, and a wiring mode of the connecting lines 20 can be simplified.

It should be noted that in FIG. 2, the second segment X2 is shown as a straight line for illustration, and the wiring direction of the second segment X2 is the second direction y. In some embodiments, the second segment X2 may be a broken line composed of a plurality of line segments.

Figure 3:
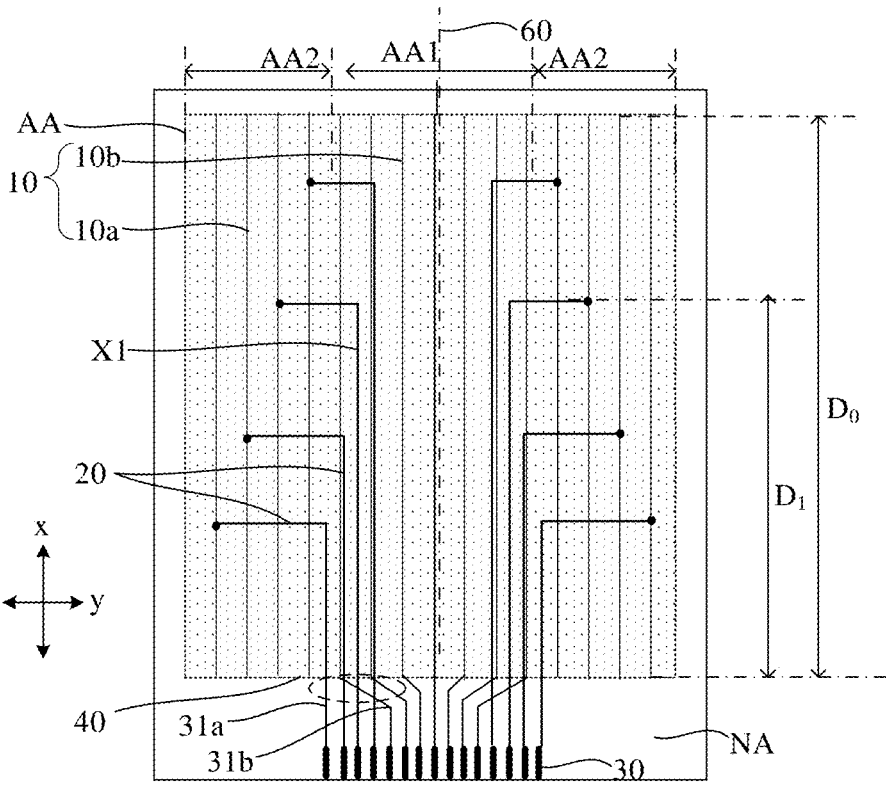
FIG. 3 is a schematic diagram of another display panel according to an embodiment of the present disclosure.

FIG. 3 is a schematic diagram of another display panel according to an embodiment of the present disclosure. As shown in FIG. 3, the display area AA includes a first display area AA1 and two second display areas AA2. In the second direction y, two second display areas AA2 are located at two sides of the first display area AA1 respectively. The display area AA has a symmetry axis 60 extending in the first direction x, and the symmetry axis 60 is located in the first display area AA1. The plurality of data lines 10 include a plurality of middle data lines 10b and a plurality of edge data lines 10a. The middle data lines 10b are located in the first display area AA1 and the edge data lines 10a are located in the edge display areas AA2. At least one of the connecting lines 20 is located in the second display areas AA2, and the connecting lines 20 are connected with respective edge data lines 10a.

The display panel further includes leads in the non-display area NA. Wires connected with the pads 30 in the non-display area NA are the leads, and the leads include first leads 31a and second leads 31b. Each of the middle data lines 10b is directly connected with a respective second lead 31b and then connected to the pad 30. Each of the edge data lines 10a is connected with the pad 30 through the connecting line 20. The connecting line 20 is connected with the pad 30 through the first lead 31a located in the non-display area NA. As shown the region circled by a dotted line in FIG. 3, the first lead 31a intersects with the second lead 31b, optionally, the first lead 31a and the second lead 31b are arranged in different metal layers at least at an intersecting position to ensure that they are insulated from each other.

In the embodiment of the present disclosure, the fan-out lines are introduced into the display area AA, and the connecting line 20 in the display area AA is configured to realize connection between the data line 10 and the pad 30, so that a width consumed by a plurality of fan-out lines in the second direction y can be reduced, thereby saving wiring space in the non-display area NA and facilitating narrowing of the non-display area NA. And the middle data line 10b is still arranged to be directly connected with the pad 30 through the second lead 31b, which can reduce a number of connecting lines 20 arranged in the display area AA, simplify the wiring mode in the display area AA, and also reduce reflection probability to the ambient light of the connecting lines 20 in the display area AA.

Figure 4:
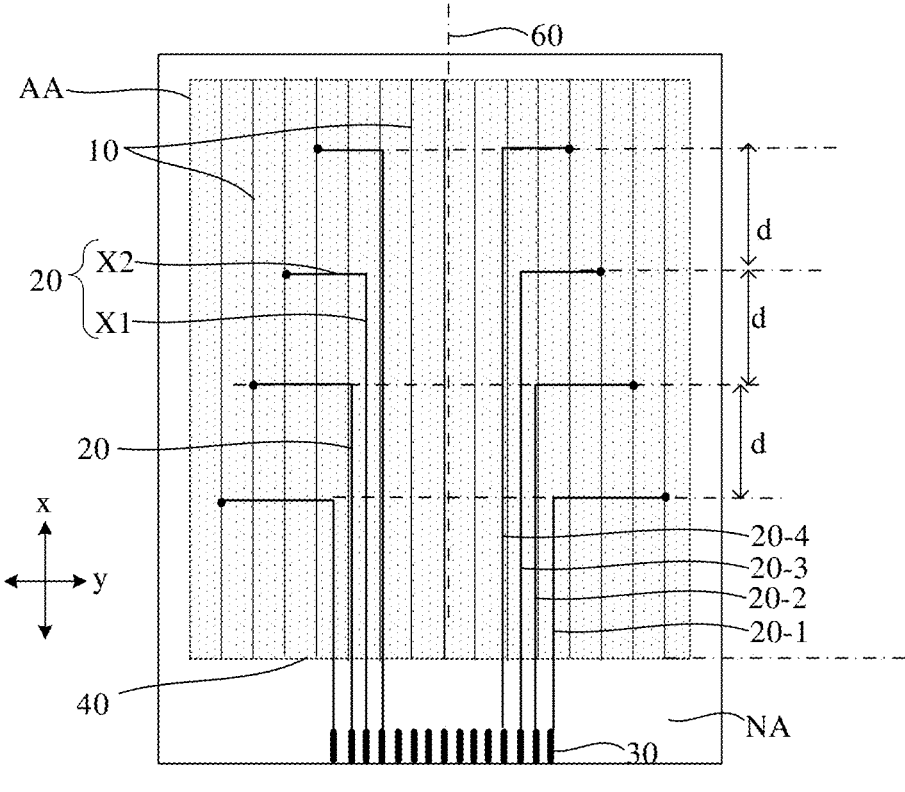
FIG. 4 is a schematic diagram of another display panel according to an embodiment of the present disclosure.

In some embodiments, at a side of the symmetry axis 60: in the second direction y and from an edge of the display area AA to the symmetry axis 60, length difference between two adjacent first segments X1 is a constant value. FIG. 4 is a schematic diagram of another display panel according to an embodiment of the present disclosure. As shown in FIG. 4, at a right side of the symmetry axis 60, the connecting lines are arranged in the direction directing to the symmetry axis 60 as follows: a connecting line 20-1, a connecting line 20-2, a connecting line 20-3 and a connecting line 20-4 in turn. First segments X1 of the connecting line 20-1, the connecting line 20-2, the connecting line 20-3 and the connecting line 20-4 gradually increase in length. Length difference between first segments X1 of the connecting line 20-2 and the connecting line 20-1 is d, length difference between first segments X1 of the connecting line 20-3 and the connecting line 20-2 is d, and length difference between first segments X1 of the connecting line 20-4 and the connecting line 20-3 is d. In this embodiment, at least part of the connecting lines 20 extend from the lower display area of the display area AA to the upper display area of the display area AA, so that a pattern of the connecting lines 20 is arranged at a plurality of positions in the first direction x in the display area AA, and the sharp change of the pattern density of the connecting lines 10 in the first direction x in the display area AA can be avoided. Meanwhile, lengths of a plurality of first segments X1 are provided to be varied arithmetically in the direction close to the symmetry axis 60, which can further improve change uniformity of the pattern density of the connecting lines 10 in the first direction x, gradually change reflection of respective areas to the ambient light in the first direction x, and further improve the problem of picture non-uniformity in an always on display state.

In addition, in an embodiment of the present disclosure, the data lines 10 correspondingly connected with the connecting lines 20-1, 20-2, 20-3 and 20-4 are arranged in sequence, and a length of the connecting line 20 affects a load on the data line 10, which in turn affects a charging or discharging speed of the data line 10, thus affecting brightness of a light-emitting element connected with the data line 10. When lengths of multiple connecting lines 20 connected with multiple data lines 10 arranged in sequence are quite different, bright and dark stripes may appear in displaying, resulting in display non-uniformity. According to an embodiment of the disclosure, lengths of the first segments X1 are arranged to be varied arithmetically in the direction directing to the symmetry axis 60, which facilitates balancing of sharp change of lengths of the connecting line 20s, so that the total lengths of the connecting lines 20 arranged in sequence are also substantially varied arithmetically, and brightness of areas where the data lines 10 connected with respective connecting lines 20 gradually changes, and bright and dark stripes can be avoided in displaying.

In some embodiments, at a left side of the symmetry axis 60 in FIG. 2: the connecting lines 20 include the first connecting line 1-20 and the second connecting line 2-20. A position where the first connecting line 1-20 is connected with the data line 10 is a first position W1, and a position where the second connecting line 2-20 is connected with the data line 10 is a second position W2. In the second direction y, a distance between the first segment X1 of the first connecting line 1-20 and the symmetry axis 60 is greater than that between the first segment X1 of the second connecting line 2-20 and the symmetry axis 60. In the first direction x, a distance between the first site W1 and the first boundary 40 is smaller than the distance between the second site W2 and the first boundary 40. That is, on a side of the symmetry axis 60, the farther a distance of the first segment X1 from the symmetry axis 60 is, the smaller a length of the first segment X1 in the first direction x is and the smaller a distance of a location where the connecting line 20 to which the first segment X1 belongs is connected with the data line 10 from the first boundary 40 is. That is, the longer the length of the first segment X1 in the first direction x is, the larger a distance of the location where the connecting line 20 to which the first segment X1 belongs is connected with the data line 10 from the symmetry axis 60 is. At least part of the connecting lines 20 extend from the lower display area of the display area AA to the upper display area of the display area AA in the first direction x. In this way, sharp change of pattern density of the connecting lines 10 in the first direction in the display area AA can be avoided, differences in reflectivities to the ambient light between the upper display area and the lower display area in the display area AA can be reduced, and the problem of picture non-uniformity in an always on display state can be addressed. The position where the connecting line 20 is connected with the data line 10 varies with the length of the first segment X1, additional wiring is not required for connection of the connecting line 20 with a respective data line 10, and a wiring mode of the connecting line 20 can be simplified.

In some embodiments, as shown in FIG. 2, on a left side of the symmetry axis 60: the data lines 10 includes a first data line 1-10 and a second data line 2-10. It can be seen that in the second direction y, a distance between the first data line 1-10 and the symmetry axis 60 is greater than that between the second data line 2-10 and the symmetry axis 60. The first connecting line 1-20 is connected with the first data line 1-10, and the second connecting line 2-20 is connected with the second data line 2-10. In this embodiment, at a side of the symmetry axis 60, a data line 10 which is farther from the symmetry axis 60 in the second direction y is connected with a connecting line 20 with a shorter first segment X1, and a data line 10 closer to the symmetry axis 60 in the second direction y is connected with a connecting line 20 with a longer first segment X1. In this arrangement, difference in length between different connecting lines 20 can be reduced, thereby reducing difference in load on the data lines 10 connected with the connecting lines 20, and thus reducing difference of charging and discharging speeds between different data lines 10, and thereby improving brightness uniformity of the light-emitting elements coupled with the data lines 10 and improving displaying performance.

In addition, taking a left side of the symmetry axis 60 in FIG. 2 as an example, in the embodiment of the present disclosure, it can be realized that the first pad 30 in the non-display area NA from left to right is connected with the first data line 10 in the display area AA from left to right, and the second pad 30 from left to right is connected with the second data line 10 in the display area AA from left to right, that is, the data lines 10 in the display area AA are sequentially connected with the pads 30 in the non-display area NA in one-to-one correspondence. In this arrangement, positions of output pins of the driving chip do not need to be adjusted, and the display panel according to the embodiment of the disclosure can be applied to most of existing driving chips.

Figure 5:
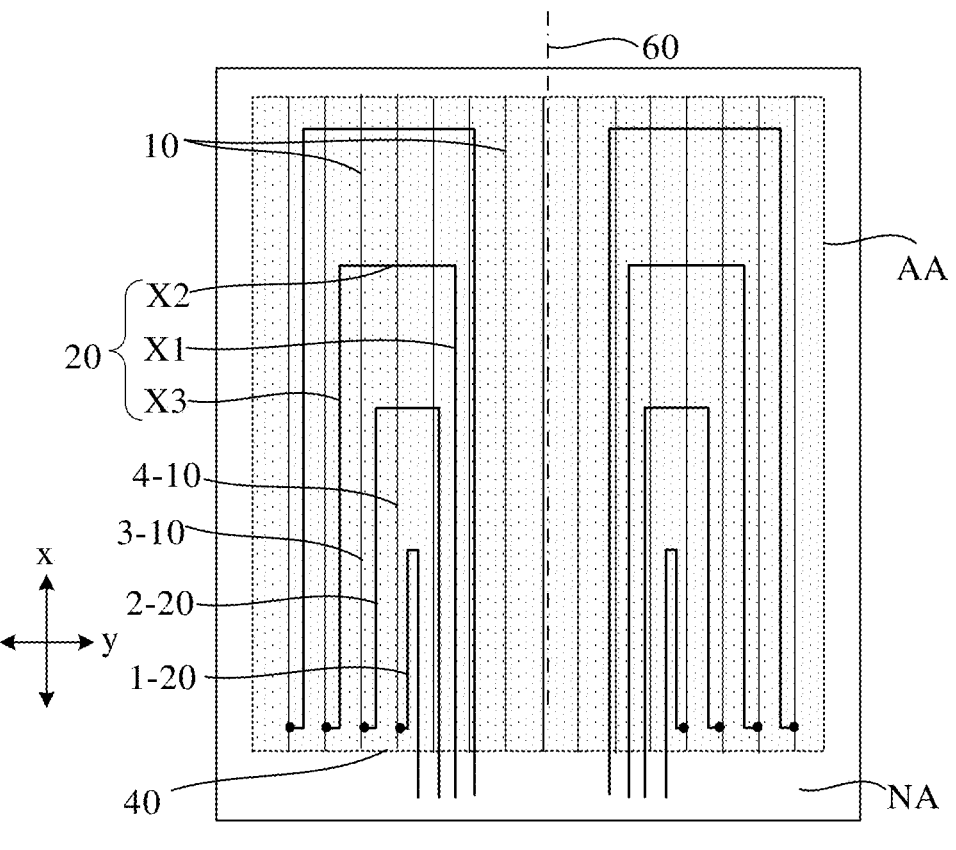
FIG. 5 is a schematic diagram of another display panel according to an embodiment of the present disclosure.

In some embodiments, FIG. 5 is a schematic diagram of another display panel according to an embodiment of the present disclosure. As shown in FIG. 5, the connecting line 20 includes a first segment X1 extending in the first direction x, a second segment X2 extending in the second direction y, and a third segment X3 extending in the first direction x. The second segment X2 is connected with the data line 10 through the third segment X3. On the left side of the symmetry axis 60: the connecting lines 20 include the first connecting line 1-20 and the second connecting line 2-20. In the second direction y, a distance between the first segment X1 of the first connecting line 1-20 and the symmetry axis 60 is greater than that between the first segment X1 of the second connecting line 2-20 and the symmetry axis. The data lines 10 include a third data line 3-10 and a fourth data line 4-10. In the second direction y, a distance between the third data line 3-10 and the symmetry axis 60 is greater than that between the fourth data line 4-10 and the symmetry axis 60. The first connecting line 1-20 is connected with the fourth data line 4-10, and the second connecting line 2-20 is connected with the third data line 3-10. In this embodiment, the connecting line 20 is arranged to include the first segment X1, the second segment X2 and the third segment X3 which are connected in sequence, and the connecting line 20 is in an approximately inverted U shape. Combined with a design in which the first segment X of the connecting line 20 extends to the upper display area of the display area AA in the embodiment of the present disclosure, it can be seen that the pattern density of the connecting line 20 is more uniform in both the first direction x and the second direction y in a display area where the connecting line 20 is located, which can further improve the problem of picture non-uniformity in an always on display state. And in the embodiment of FIG. 5, it can be observed that a respective connecting line 20 is connected with the data line 10 at a position close to the first boundary 40 in the display area AA, and a distance between the non-display area NA and a position where the respective connecting line 20 is connected with the data line 10 in the first direction x is substantially the same, so that a distance between a charging and discharging position of a respective data line 10 and the first boundary 40 is substantially the same.

Figure 6:
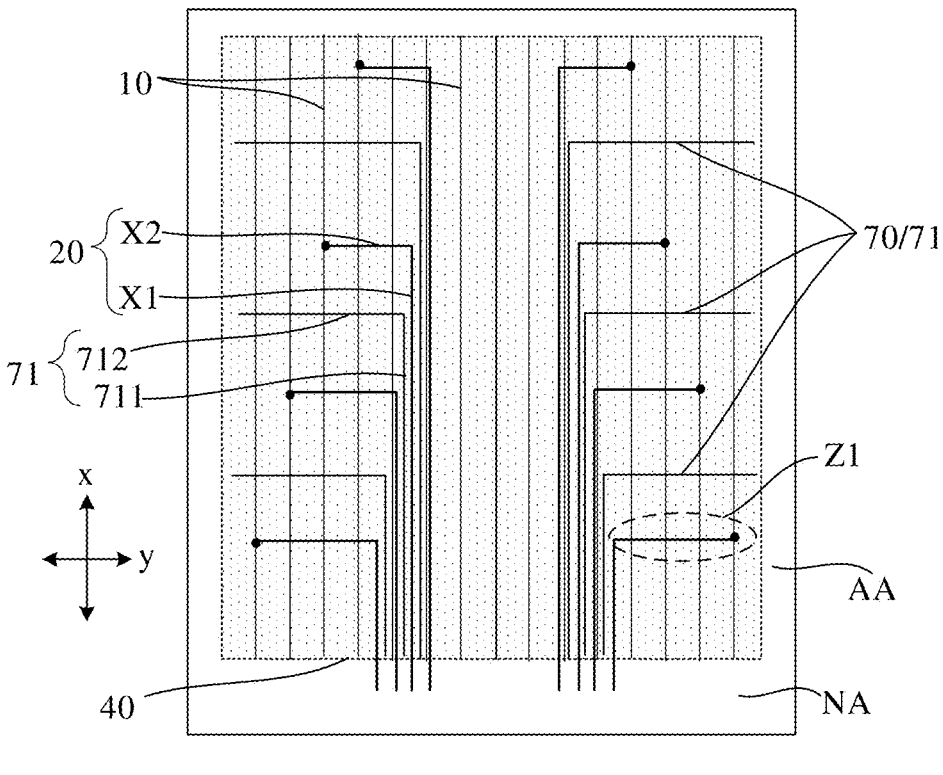
FIG. 6 is a schematic diagram of another display panel according to an embodiment of the present disclosure.

In some embodiments, FIG. 6 is a schematic diagram of another display panel according to an embodiment of the present disclosure. As shown in FIG. 6, the display area AA includes dummy lines 70, and the dummy lines 70 includes a first dummy line 71. Two adjacent connecting lines 20 are spaced apart by at least one first virtual line, and a wiring direction of the first dummy line 71 is the same as that of the connecting line 20. In the embodiment of the present disclosure, the connecting line 20 includes at least a first segment X1 extending in the first direction x and a second segment X2 extending in the second direction y. The extending direction of the second segment X2 intersects with the extending direction of the data line 10 in the display area AA, so the second segment X2 may be insulated and overlapped with the data lines 10 in the display area AA (as shown in a schematic diagram of a circled position of the area Z1 in FIG. 6). As a result, there is deleterious and significant signal crosstalk on the connecting line 20, and there is also a problem of signal crosstalk between adjacent connecting lines 20. In the embodiment of the present disclosure, the first dummy line 71 is arranged between adjacent connecting lines 20, and a wiring direction of the first dummy line 71 is the same as that of the connecting line 20, so that the problem of signal crosstalk can be solved using the first dummy line 71, and stability of data signals transmitted on the connecting line 20 can be guaranteed.

In some embodiment, the first dummy line 71 can be arranged to improve uniformity of the pattern density in the display area AA, to further reduce the difference in reflection to the ambient light between different areas in the display area AA, and improve the problem of picture non-uniformity in an always on display state.

In FIG. 6, it is illustrated that only one first dummy line 71 is arranged between two adjacent connecting lines 20. In some embodiments, two or more first dummy lines 71 are arranged between two adjacent connecting lines 20, which is not illustrated here in the figure.

In some embodiments, the first dummy line 71 and the connecting line 20 are provided in a same layer and made of a same material. As shown in FIG. 6, the first dummy line 71 includes a first dummy segment 711 extending in the first direction x and a second dummy segment 712 extending in the second direction y. The first dummy segment 711 and the second dummy segment 712 are connected with each other. The first dummy segment 711 and the second dummy segment 712 are provided in a same layer and made of a same material as the connecting line 20. In this embodiment, the first dummy line 71 and the connecting line 20 can be simultaneously manufactured in a same process, which can simplify manufacturing processes. In some embodiments, the first dummy line 71 and the connecting line 20 are provided in a same layer, which has more significant effect on preventing signal crosstalk between adjacent connecting lines 20.

As shown in FIG. 6, the first dummy line 71 includes the first dummy segment 711 extending in the first direction x, and the first dummy segment 711 is located between two adjacent first segments X1. That is, the extension direction of the first virtual line segment 711 between the two adjacent first segments X1 and the extension direction of the two adjacent first segments X1 are the same. When the first dummy line 71 and the connecting line 20 are provided in a same layer and made of a same material, the first dummy segment 711 and the first segment X1 have a same extension direction, which facilitates simplifying of a mask design, but if the dummy segment between adjacent first segments X1 intersects with the extension direction of the first segment X1, complexity of the mask design can be increased.

Figure 7:
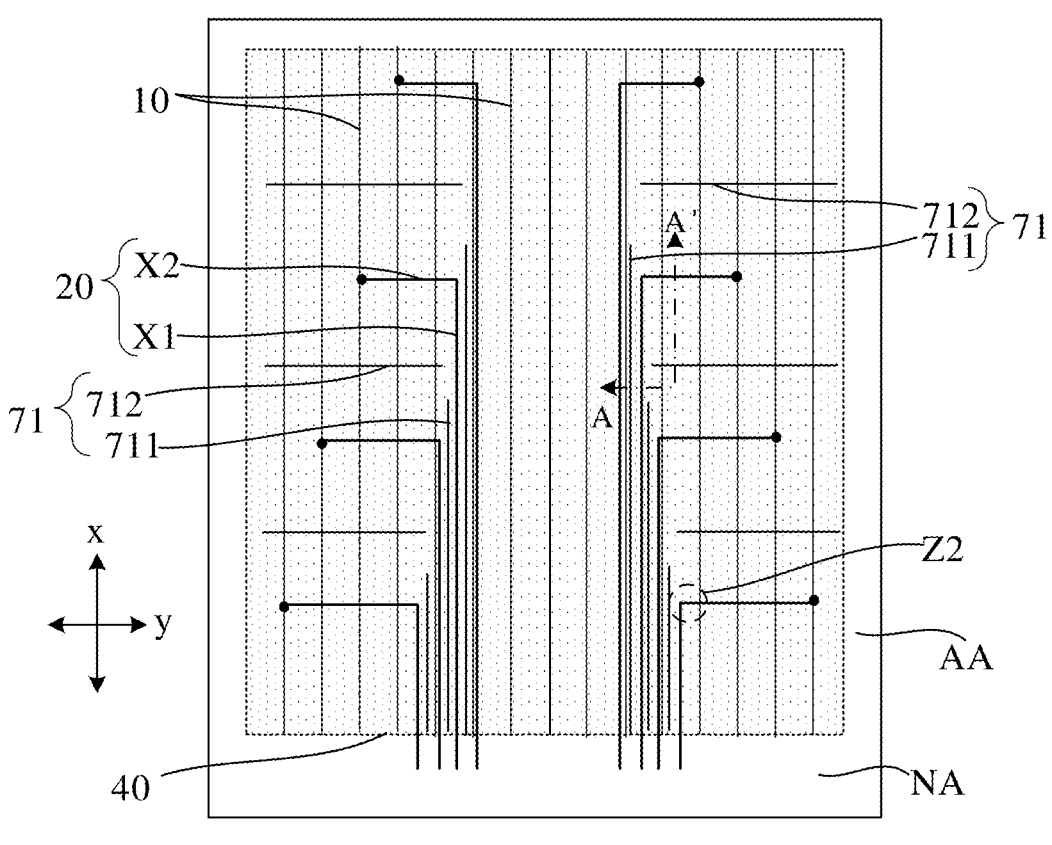
FIG. 7 is a schematic diagram of another display panel according to an embodiment of the present disclosure.
Figure 8:
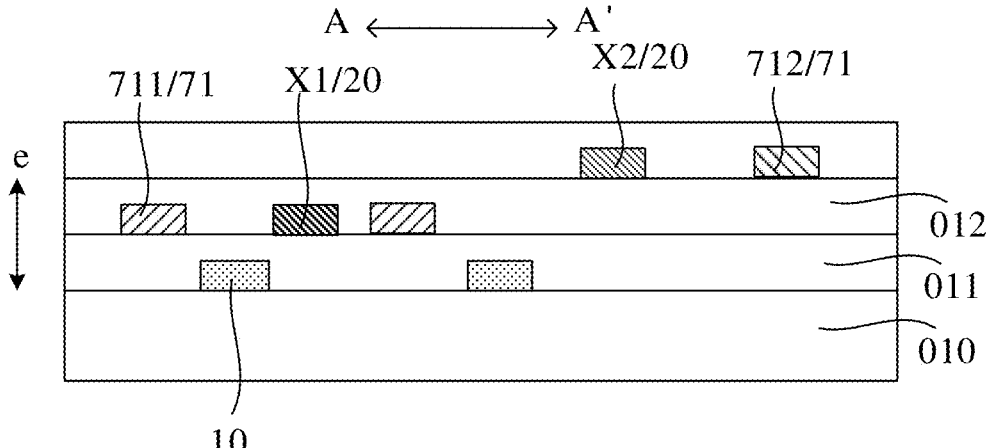
FIG. 8 is a schematic cross-sectional view along a cutting line A-A' in FIG. 7 according to an embodiment of the present disclosure.

In some embodiments, FIG. 7 is a schematic diagram of another display panel according to an embodiment of the present disclosure, and FIG. 8 is a schematic cross-sectional view along a cutting line A-A' in FIG. 7. As shown in FIG. 7, the connecting line 20 includes a first segment X1 extending in the first direction x and a second segment X2 extending in the second direction y. The first segment X1 and the second segment X2 are electrically connected with each other. The first dummy line 71 includes a first dummy segment 711 extending in the first direction x and a second dummy segment 712 extending in the second direction y. The first dummy segment 711 is located between two adjacent first segments X1 and the second dummy segment 712 is located between two adjacent second segments X2.

As shown in FIG. 8, the display panel further includes a substrate 010, and the dummy segment, the connecting line and the data line are all located on a same side of the substrate 010. The first dummy segment 711 and the first segment X1 are provided in a same layer and made of a same material, the second dummy segment 712 and the second segment X2 are provided in a same layer and made of a same material, and the first dummy segment 711 and the second dummy segment 712 are located in different layers. In this embodiment, the first segment X1 and the second segment X2 of the connecting line 20 are located in different layers, that is, the connecting line 20 is made of two metal layers, and the two segments with different extension directions in the connecting line 20 are located in different layers. The first segment X1 and the second segment X2 are connected through a via penetrating the insulating layer at a region indicated by Z2 in FIG. 7.

As can be seen from FIG. 8, both the connecting line 20 and the first dummy line 71 are located at a side of the data line 10 away from the substrate 010. The second segment X2 and the second dummy segment 712 are located on a same layer and at the side of the first virtual line segment 711 and the first segment X1 away from the substrate 010. A first insulating layer 011 is provided between the data line 10 and a layer where the first segment X1 is located, and a second insulating layer 012 is provided between the layer where the second segment X2 is located and the layer where the first segment X1 is located. At least a first insulate layer 011 and a second insulate layer 012 are arranged between the second segment X2 and the data line 10 in the direction e perpendicular to the plane of the substrate 010. In the embodiment of the disclosure, the first segment X1 and the second segment X2 are arranged in different layers, and the second segment X2 is located at a side of the first segment X1 away from the data line 10, which can increase a distance between the second segment X2 and the data line 10 in the direction e perpendicular to the plane of the substrate 010, thereby reducing crosstalk caused by the overlapping of the second segment X2 and the data lines 10, and ensuring stability of the data signals transmitted on the connecting line 20.

In some embodiments, the first dummy segment 711 and the first segment X1 are provided to extend in a same direction and are located in a same layer. Since the first dummy segment 711 and the first segment X1 are located in a same layer, the first dummy segment 711 can provide a well shielding effect, which can prevent signal crosstalk between two adjacent first segments X1. The second dummy segment 712 and the second segment X2 are arranged to extend in a same direction and are located in a same layer. Since the second dummy segment 712 and the second segment X2 are located in a same layer, the second dummy segment 712 can provide a well shielding effect, which can prevent signal crosstalk between two adjacent second segments X2.

In the embodiment shown in FIG. 7, the first dummy segment 7111 and the second dummy segment 712 are not connected with each other. In other embodiments, the first dummy segment 7111 and the second dummy segment 712 are located in different metal layers and are connected through a via penetrating the insulating layer.

Figure 9:
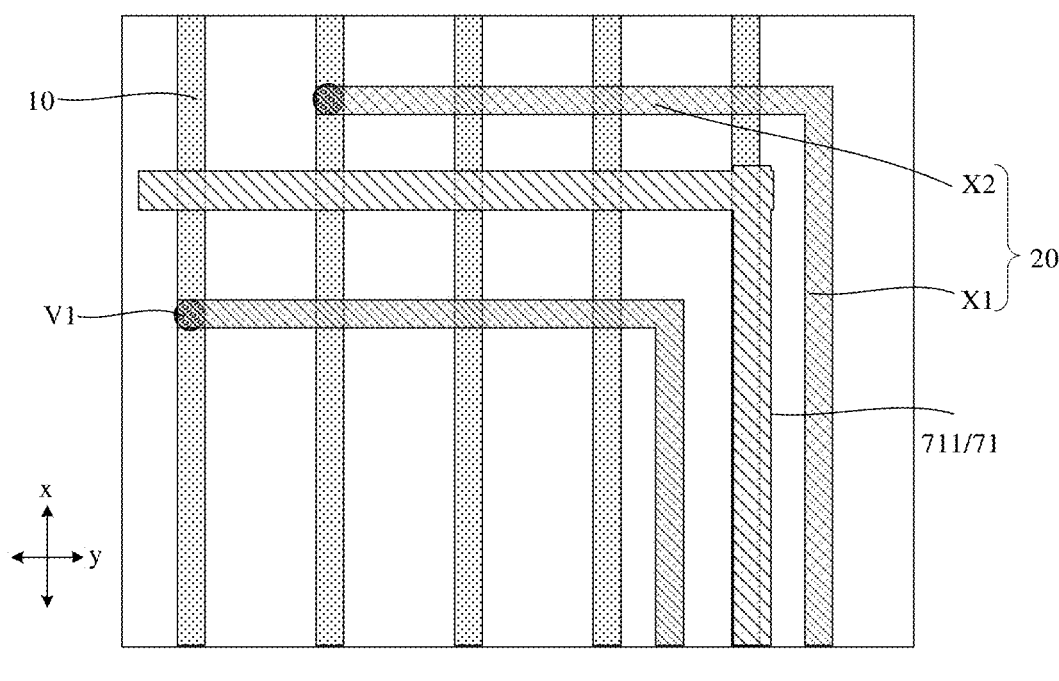
FIG. 9 is a schematic diagram of another display panel according to an embodiment of the present disclosure.

In some embodiments, FIG. 9 is a schematic diagram of another display panel according to an embodiment of the present disclosure. In FIG. 9, only a part of the display panel is illustrated. In order to clearly show a relationship among the first segment X1, the data line 10 and the first dummy segment 711 in the display panel, only these segments are shown in FIG. 9, but other circuits and structures of a light-emitting element are not shown. As shown in FIG. 9, in one or more pair of adjacent first segments X1, the adjacent two first segments X1 are spaced apart by at least one data line 10. FIG. 9 is a top view of the display panel. It can be understood that the top view direction is parallel to the direction perpendicular to the plane of the substrate 010, and the first virtual line segment 711 and the data line 10 at least partially overlap in the direction perpendicular to the plane of the substrate 010. The first segment X1 extends from the first boundary 40 into the display area AA in the first direction x. In order to save the space of the non-display area NA, a plurality of connecting lines 20 are arranged at a side of the symmetry axis 60, and the plurality of connecting lines 20 extend into the display area AA from the first boundary 40.

In an embodiment of the disclosure, a number of connecting lines 20 in the display area AA, arrangement density of the first segment X1 in the display area AA, and space saving of the non-display area NA, etc. can be comprehensively considered. In some embodiments, after the connecting line 20 is provided in the display area AA, the connecting line 20 is connected with the pad 30 through the first lead 31a (see the schematic diagram in FIG. 3). Therefore, a wiring mode of the first lead 31a also needs to be considered, and a pitch between adjacent first leads 31a also needs to be designed and adapted to a spacing between adjacent pads 30. According to the embodiment of the disclosure, in one or more pair of adjacent first segments X1, two adjacent first segments X1 in the display area AA is spaced apart by at least one data line 10, so that the pitch between two adjacent first segments X1 arranged in the display area AA is substantially the same as a pitch between two adjacent data lines 10, thus facilitating wiring of the first lead 31a in the non-display area NA. The pitch between the adjacent first leads 31a can be designed with reference to a pitch between adjacent second leads 31b, that is, the pitch between the adjacent first leads 31a can be designed with reference to a pitch between fan-out lines in the related art, which can simplify a wiring design of the first lead 31a.

In same embodiments, both the first dummy segment 711 and the data line 10 are made of a metal material, so both the first dummy segment 711 and the data line 10 reflect the ambient light. In the embodiment of the present disclosure, the first dummy segment 711 is arranged to at least partially overlap with the data line 10, and the first dummy segment 711 can shield a part of the data line 10, thereby reducing overall reflection and improving the displaying performance.

Figure 10:
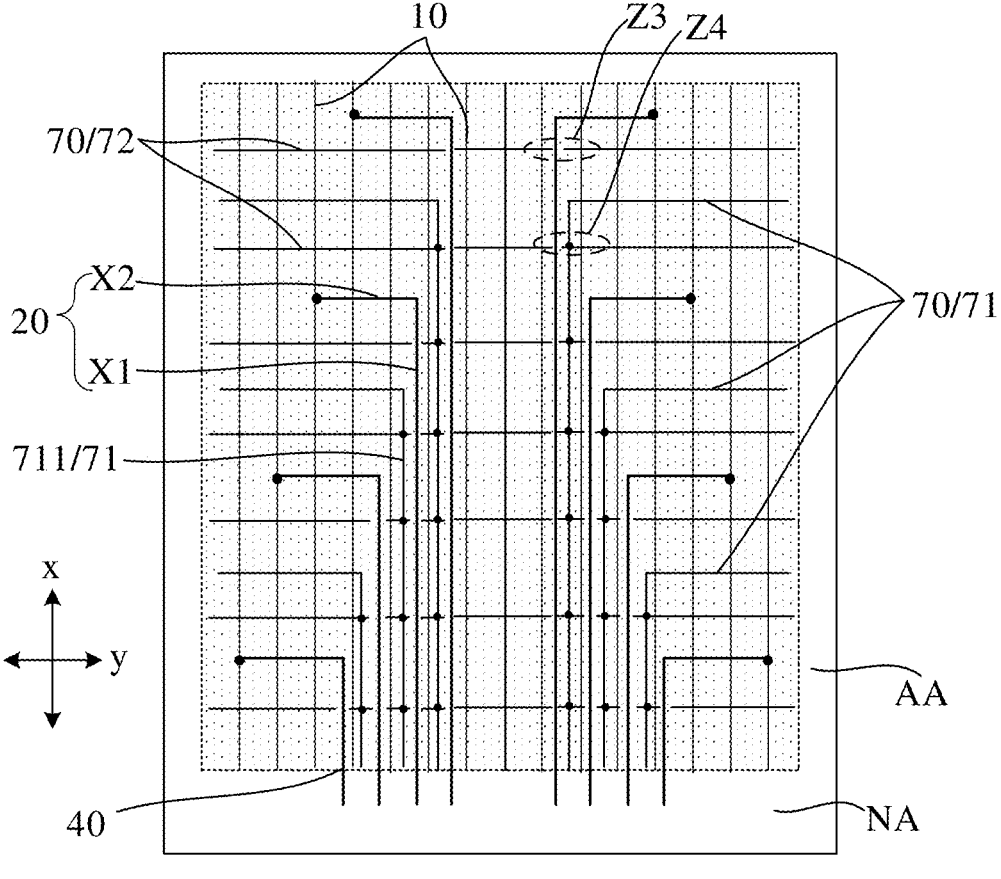
FIG. 10 is a schematic diagram of another display panel according to an embodiment of the present disclosure.

In some embodiments, FIG. 10 is a schematic diagram of another display panel according to an embodiment of the present disclosure. As shown in FIG. 10, the dummy lines 70 include a first dummy line 71 and a second dummy line 72. The first dummy line 71 is located between adjacent connecting lines 20, and an extension direction of the first dummy line 71 is the same as that of the connecting line 20, and the second dummy line 72 extends in the second direction y. Optionally, at least part of the second dummy line 72 runs across the display area AA in the second direction y. At least one second dummy line 72 intersects with at least one first segment X1, and the second dummy line 72 is broken at an intersecting position (also referred to as a first position) with the first segment X1. The breaking of the second virtual line 72 at the intersecting position (also referred to as a second position) with the first segment X1 can be referred to the schematic diagram of an area Z3 in FIG. 10. At least one second dummy line 72 intersects with at least one first dummy line 71, and the second dummy line 72 is connected with the first dummy line 71 at an intersecting position. For connection of the second dummy line 72 with the first dummy line 71 at the intersecting position, reference can be made to the schematic diagram of an area Z4 in FIG. 10. The second dummy line 72 provided in the embodiment of the present disclosure can further improve overall uniformity of the pattern density in the display area AA, and improve the problem of picture non-uniformity in an always on display state.

In the embodiment of the present disclosure, the second dummy line 72 may be located in a same layer as the first segment X1, or the second dummy line 72 may be located in a different layer from the first segment X1. When the second dummy line 72 and the first segment X1 are located in a same metal layer, the second dummy line 72 is arranged to be broken at the first position where it intersects with the first segment X1, so that the second dummy line 72 does not affect signal transmission of the first segment X1 and not increase a load on the connecting line 20. When the second dummy line 72 and the first segment X1 are located in different layers, taking the second dummy line 72 being located at a side of the first segment X1 close to the substrate 010 as an example, a patterned second dummy line 72 is first fabricated in manufacturing, then an insulating layer is fabricated on the second dummy line 72, and then the first segment X1 is fabricated. Since the second dummy line 72 is arranged to be broken at the intersecting position with the first segment X1, a position where the second dummy line 72 is broken is equivalent to a groove, and a part of the first segment X1 manufactured later is in the groove. With this arrangement, flatness of a module after formation of the first segment X1 can be improved.

In the embodiment of the present disclosure, an extension direction of the first dummy segment 711 in the first dummy line 71 is the same as an extension direction of the first segment X1. As can be seen from FIG. 10, the second dummy line 72 is connected with the first dummy segment 711 at the intersecting position. The first dummy segment 711 may be located in a same layer as the first segment X1 or at a different layer from the first segment X1. That is, the second dummy line 72 may be located at a same layer as the first dummy segment 711 or at a different layer from the first dummy segment 711. When the second dummy line 72 and the first dummy segment 711 are located in a same layer, they are directly in contact with each other at the intersecting position. When the second dummy line 72 and the first dummy segment 711 are located in different layers, they are connected at the intersecting position through a via penetrating the insulating layer. In the embodiment of the present disclosure, the second dummy line 72 is connected with the first dummy line 71. When a constant voltage signal is applied to the first dummy line 71 and the second dummy line 72, such as a power signal (which can be a positive power signal or a negative power signal), for driving the pixel circuit to operate, it facilitates reducing of voltage drop of the power signal and improves uniformity of the power signal in the display area AA. When a reset signal for driving the pixel circuit is applied to the first dummy line 71 and the second dummy line 72, it facilitates reducing of voltage drop of the reset signal and improves uniformity of the reset signal in the display area AA.

Figure 11:
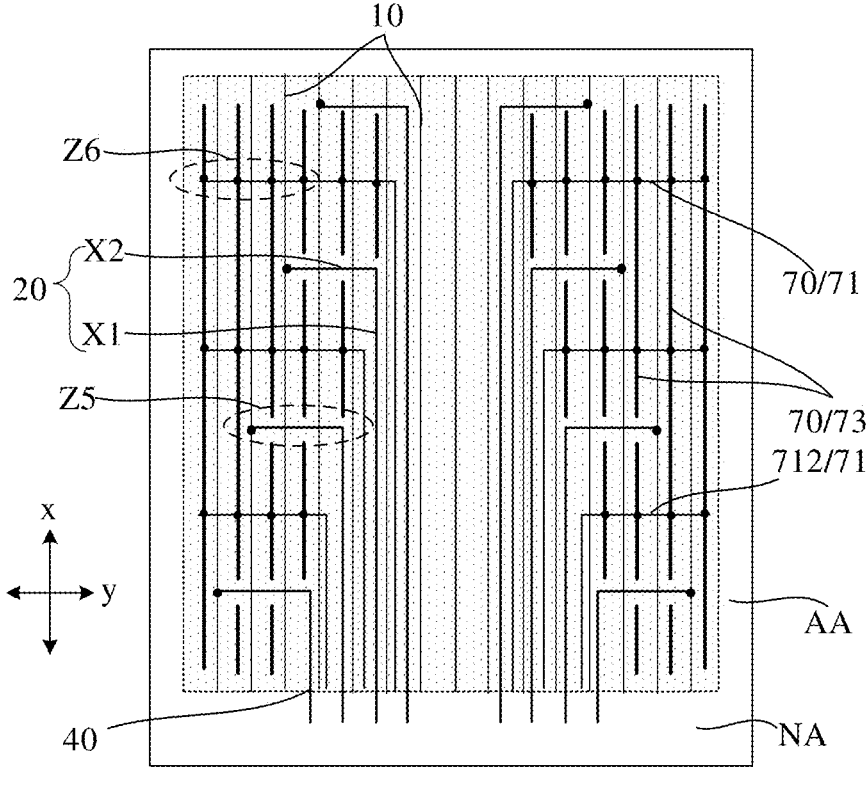
FIG. 11 is a schematic diagram of another display panel according to an embodiment of the present disclosure.

In some embodiments, FIG. 11 is a schematic diagram of another display panel according to an embodiment of the present disclosure. As shown in FIG. 11, the dummy lines 70 further include a third dummy line 73 extending in the first direction x. At least one third dummy line 73 intersects with at least one second segment X2, and the third dummy line 73 is broken at an intersecting position (also referred to as a first position) with the second segment X2. At least one third dummy line 73 intersects with at least one first dummy line 71, and the third dummy line 73 is connected with the first dummy line 71 at this intersecting position (also referred to as a second position). As illustrated in FIG. 11, one or more third dummy lines 73 run across the display area AA in the first direction x. It should be noted that, since the third dummy line 73 extends in a same direction as the data line 10, in order to clearly distinguish the third dummy line and the data line, a bold black line is used to indicate the third dummy line 73 in FIG. 11, but it does not limit a line width of the third dummy line 73.

A connecting line 20 is arranged in the display area AA, and the connecting line includes a first segment X1. The first segments X1 of one or more connecting lines 20 extend to the upper display area of the display area AA, while the first segments X1 of one or more connecting lines 20 have a shorter length and only extend to the lower display area of the display area AA. There is a problem that the first segment X1 is unevenly distributed in the second direction y in the display area AA, which can be understood by referring to the FIG. 6 described above. In FIG. 6, there is substantially no first segment X1 in the region close to the left edge of the display area AA and the region close to the right edge of the display area AA. In order to further improve the uniformity of pattern density in the display area AA, in the embodiment of the present disclosure, a third dummy line 73 is provided, and an extension direction of the third dummy line 73 is the same as that of the first segment X1, and a pattern of the third dummy line 73 is for balancing difference of wiring density at different positions in the first direction x.

In the embodiment of the present disclosure, the third dummy line 73 may be located in a same layer as the second segment X2, or the third dummy line 73 may be located in a different layer from the second segment X2. When the third dummy line 73 is located in the same layer as the second segment X2, the third dummy line 73 is arranged to be broken at a position where it intersects with the second segment X2, so that the third dummy line 73 does not affect the signal transmission of the second segment X2 and not increase the load on the connecting line 20. When the third dummy line 73 and the second segment X2 are located in different layers, for example the third dummy line 73 is located at a side of the second segment X2 close to the substrate 010, a patterned third dummy line 73 is first fabricated in manufacturing, then an insulating layer is fabricated on the third dummy line 73, and then the second segment X2 is fabricated. Since the third dummy line 73 is arranged to be broken at the intersecting position with the first segment X2, a position where the third dummy line 73 is broken is equivalent to a groove, and a part of the second segment X2 manufactured later is just in the groove. With this arrangement, flatness of a module after processing of the second segment X2 can be improved.

In the embodiment of the present disclosure, an extension direction of the second dummy segment 712 in the second dummy line 71 is the same as an extension direction of the second segment X2. As can be seen from FIG. 11, the third dummy line 73 is connected with the second dummy segment 712 at the intersecting position. The second dummy segment 712 may be located in a same layer as the second segment X2 or in a different layer from the second segment X2. That is, the third dummy line 73 may be located at a same layer as the second dummy segment 712 or at a different layer from the second dummy segment 712. When the third dummy line 73 and the second dummy segment 712 are located in a same layer, they are directly in contact with each other at the intersecting position. When the third dummy line 73 and the second dummy segment 712 are located in different layers, they are connected at the intersecting position by a via penetrating the insulating layer. In the embodiment of the present disclosure, the third dummy line 73 is connected with the first dummy line 71. When the first dummy line 71 and the third dummy line 73 are connected with a constant voltage signal, such as a power signal (which can be a positive power signal or a negative power signal) for driving the pixel circuit to operate, it facilitates reducing of voltage drop of the power signal and improves uniformity of the power signal in the display area AA. When the first dummy line 71 and the third dummy line 73 are connected with a reset signal that drives the pixel circuit to operate, it facilitates reducing of voltage drop of the reset signal and improves uniformity of the reset signal in the display area AA.

Figure 12:
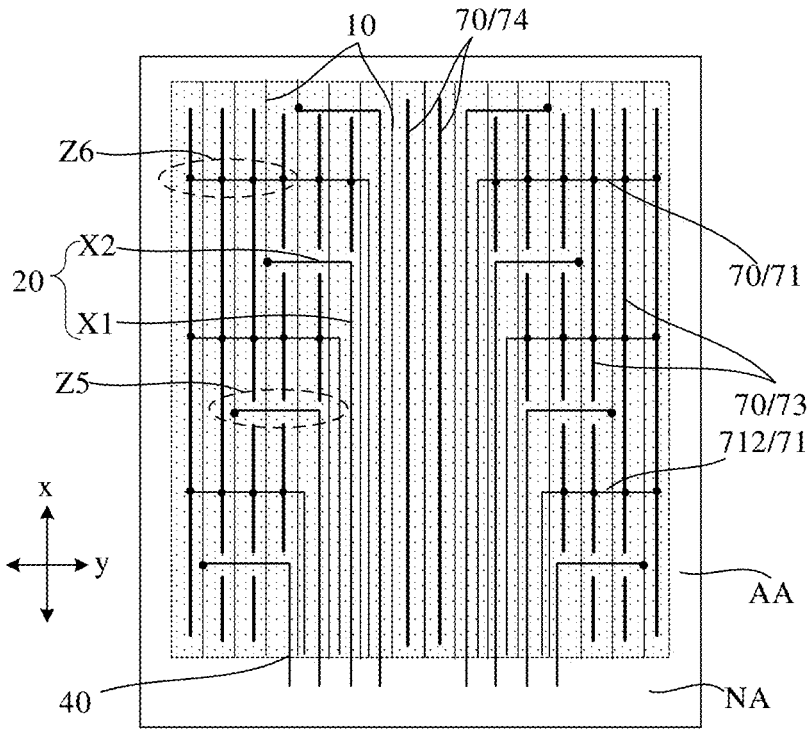
FIG. 12 is a schematic diagram of another display panel according to an embodiment of the present disclosure.

In some embodiments, FIG. 12 is a schematic diagram of another display panel according to an embodiment of the present disclosure. As shown in FIG. 12, the dummy lines 70 further include a fourth dummy line 74 extending in the first direction x, and the fourth dummy line 74 does not intersect with the connecting line 20. The fourth dummy line 74 runs across the display area AA in the first direction x. It should be noted that, since the fourth dummy line 74 extends in a same direction as the data line 10, in order to clearly distinguish the fourth dummy line 74 and the data line, a bold black line is used to indicate the fourth dummy line 74 in FIG. 12, but it does not limit a line width of the fourth dummy line 74. As illustrated in FIG. 12, the connecting lines 20 are substantially arranged at the region close to the left edge and the region close to the right edge of the display area AA, and no connecting line 20 is arranged in a middle area of the display area AA. Therefore, in the embodiment of the present disclosure, the fourth dummy line 74 is arranged to extend in the first direction x, and a pattern of the fourth dummy line 74 is arranged to balance difference of pattern density between the middle area and left and right areas of the display area AA, so as to further enhance the uniformity of pattern density in the display area AA and improve the picture non-uniformity in an always on display state.

It is illustrated in FIG. 12 that the dummy lines 70 include a first dummy line 71 with a same wiring direction as the connecting line 20, a third dummy line 73 and a fourth dummy line 74 extending in the first direction x.

In some embodiments, the first dummy line segment 711 and the second dummy segment 712 in the first dummy line 71 are located in a same layer, and the fourth dummy line 74 is located in a same layer as the first dummy line 71.

In another embodiment, the first dummy segment 711 and the second dummy segment 712 in the first dummy line 71 are located in different layers, and the fourth dummy line 74 and the first dummy segment 711 with a same extension direction as the fourth dummy line 74 are located in a same layer.

Figure 13:
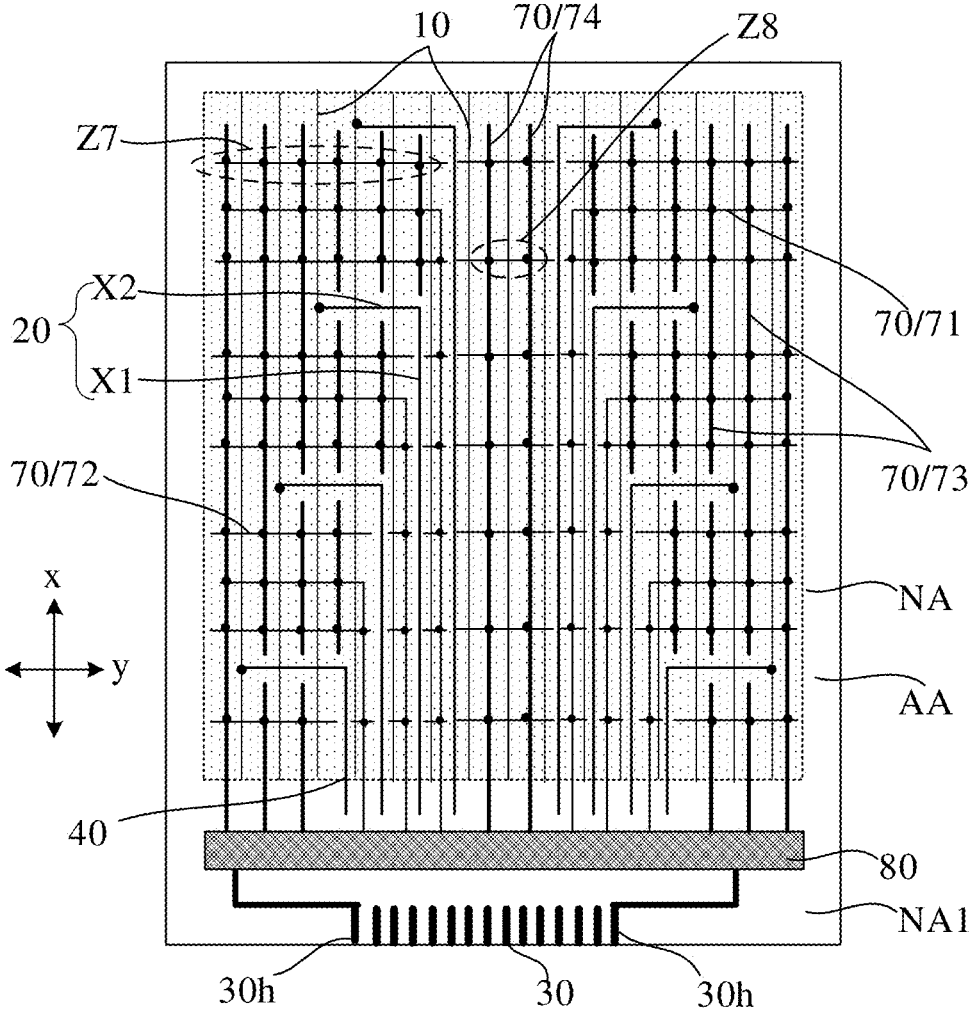
FIG. 13 is a schematic diagram of another display panel according to an embodiment of the present disclosure.

In some embodiments, FIG. 13 is a schematic diagram of another display panel according to an embodiment of the present disclosure. As shown in FIG. 13, the display area AA includes: a first dummy line 71, a second dummy line 72, a third dummy line 73, and a fourth dummy line 74. As indicated by an area Z7 in FIG. 13, the second dummy line 72 intersects with the third dummy line 73, and are connected at this intersecting position. As indicated by an area Z8 in FIG. 13, the second dummy line 72 intersects with the fourth dummy line 74, and are connected at this intersecting position. It can be seen that in an embodiment the display area AA including the first dummy line 71, the second dummy line 72, the third dummy line 73, and the fourth dummy line 74, intersecting dummy lines 70 are connected with each other, and the dummy lines 70 form an approximate grid-like structure in the whole display area AA. With this arrangement, the uniformity of pattern density in the display area AA can be improved. In addition, when the dummy line 70 is connected with a constant voltage, it is possible to reduce an overall impedance and improve in-plane uniformity of the constant voltage.

In the embodiment the display area AA including the first dummy line 71, the second dummy line 72, the third dummy line 73, and the fourth dummy line 74, optionally, two metal layers are used to make the dummy lines. The dummy lines extending in the first direction x are located in a same layer, and the dummy lines extending in the second direction y are located in another layer. For example, the first dummy segment 711 in the first dummy line 71, the third dummy line 73 and the fourth dummy line 74 extending in the first direction x are located in the same layer, and the second dummy line 72 and the second dummy segment 712 in the first dummy line 71 extending in the second direction Y are located in the same layer. Two dummy lines with mutually intersected extension directions are connected at the intersecting position through a via penetrating the insulating layer.

In some embodiments, the first segment X1 and the second segment X2 of the connecting line 20 are located in different layers. The first segment X1 is located in a same layer as the dummy line extending in the first direction x, the second segment X2 is located in a same layer as the dummy line extending in the second direction y, and a layer where the second segment X2 is located is at a side of a layer where the first segment X1 is located away from the substrate 010. With this arrangement, a distance between the second segment X2 and the data line 10 can be increased in the direction perpendicular to the plane of the substrate 010, so that signal crosstalk caused by the intersection of the second segment X2 and the data line 10 can be reduced.

In some embodiments, as shown in FIG. 13, the non-display area NA includes a first non-display area NA1, and the plurality of pads 30 are located in the first non-display area NA1. Each of the pads 30 includes a constant voltage signal terminal 30h for providing a constant voltage signal. The first non-display area NA1 includes a first constant voltage bus 80, and the dummy lines 70 are connected with the constant voltage signal terminal 30h through the first constant voltage bus 80. In the embodiment of the present disclosure, the dummy lines 70 are arranged to be connected with the constant voltage signal terminal 30h, the constant voltage signal is transmitted on the dummy lines 70, and the constant voltage signal can be, for example, a power signal or a reset signal for driving the pixel circuit to operate.

In FIG. 13, it is illustrated that the first dummy line 71 extends to the first non-display area NA1 and is connected with the first constant-voltage bus 80, a part of second dummy lines 72 extend to the first non-display area NA1 and are connected with the first constant-voltage bus 80, and the fourth dummy line 74 extends to the first non-display area NA1 and is connected with the first constant-voltage bus 80. With this arrangement, the first constant voltage bus 80 is connected with the dummy lines 70 in the display area AA through a plurality of connection positions, which can improve the uniformity of constant voltage signals at various positions and brightness uniformity of the display area.

Figure 14:
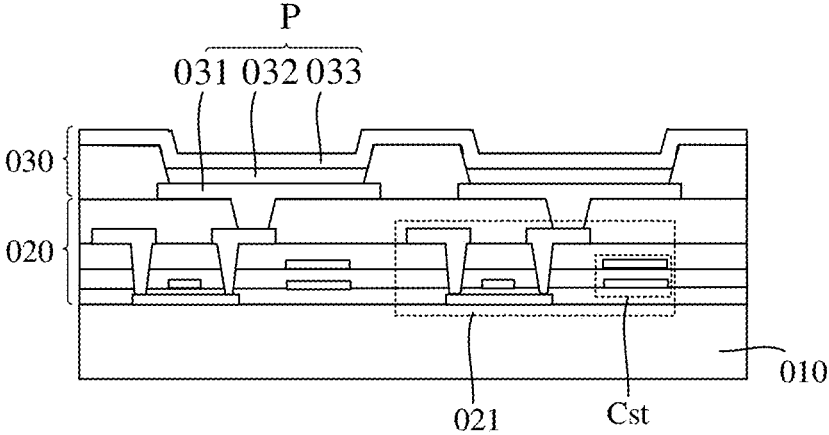
FIG. 14 is a schematic diagram of layers of a display panel according to an embodiment of the present disclosure.
Figure 15:
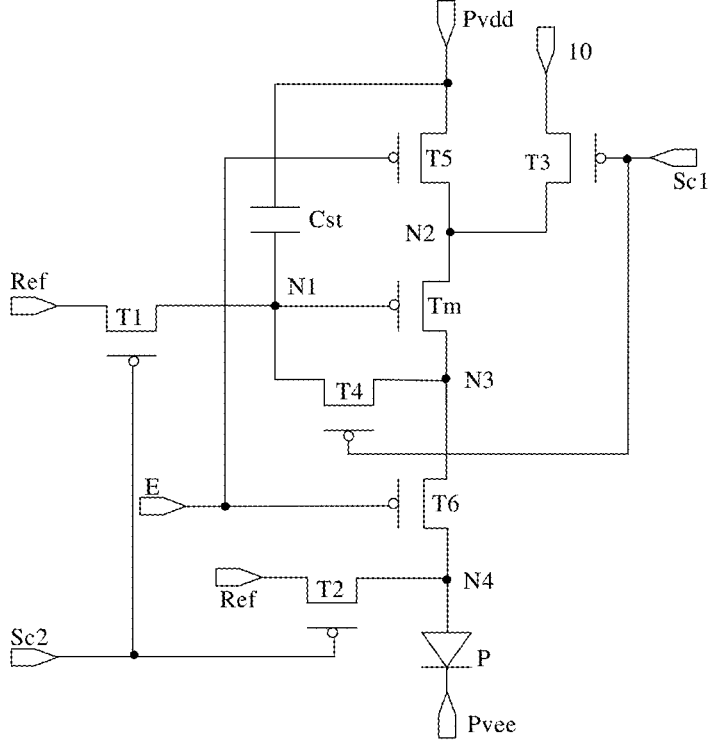
FIG. 15 is a circuit diagram of a pixel circuit in a display panel according to an embodiment of the present disclosure.

FIG. 14 is a schematic diagram of layers of another display panel according to an embodiment of the present disclosure, and FIG. 15 is a circuit diagram of a pixel circuit in the display panel according to an embodiment of the present disclosure. As shown in FIG. 14, the display panel further includes a substrate 010, an array layer 020 and an element layer 030 located at a side of the substrate 010. The array layer 020 includes a plurality of pixel circuits 021, and the element layer 030 includes a plurality of light-emitting elements P. Each of the light-emitting elements p includes a first electrode 031, a light-emitting layer 032, and a second electrode 033 which are stacked. Only one transistor in the pixel circuit 021 is shown schematically in FIG. 14. With reference to FIG. 15, the first electrode 031 is connected with a first power signal line Pvdd through the pixel circuit 021, and the second electrode 033 is connected with a second power signal line Pvee.

As shown in FIG. 15, the pixel circuit includes a driving transistor Tm, a gate reset transistor T1, an electrode reset transistor T2, a data writing transistor T3, a threshold compensation transistor T4, a first light emission control transistor T5, a second light emission control transistor T6, and a storage capacitor Cst. The gate reset transistor T1 is configured to reset a gate of the driving transistor Tm, and the electrode reset transistor T2 is configured to reset the light-emitting element P. A first electrode of the gate reset transistor T1 is connected with a reset signal line Ref, which is configured to provide a reset signal. A second electrode of the gate reset transistor T1 is connected with a first node N1, the gate of the driving transistor Tm is connected with the first node N1, a first electrode of the driving transistor Tm is connected with a second node N2, and a second electrode of the driving transistor Tm is connected with a third node N3. The driving transistor Tm is connected in series between the first light emission control transistor T5 and the second light emission control transistor T6. A first electrode of the data writing transistor T3 is connected with the data line 10, a second electrode of the data writing transistor T3 is connected with the second node N2, and the threshold compensation transistor T4 is connected in series between the first node N1 and the third node N3. A first plate of the storage capacitor Cst and an electrode of the first light emission control transistor T5 are both connected with the first power signal line Pvdd. A first electrode of the electrode reset transistor T2 is connected with the reset signal line Ref, and a second electrode of the electrode reset transistor T2 and the first electrode of the light-emitting element P are connected with a fourth node N4. The second electrode of the light-emitting element P is connected with the second power signal line Pvee. The first power signal line Pvdd is a positive power line, and the second power signal line Pvee is a negative power line. A gate of the data transistor T3 and a gate of the threshold compensation transistor T4 are connected with a first scanning line Sc1, a gate of the gate reset transistor T1 and a gate of the electrode reset transistor T2 are connected with a second scanning line Sc2, and gates of the first light emission control transistor T5 and the second light emission control transistor T6 are connected with the light emission control line E. It should be noted that a pixel circuit with only seven transistors and one capacitor is shown schematically in FIG. 15, which is not intended to limit the present disclosure.

In an embodiment, the constant voltage signal terminals 30h include: a first power terminal, and the dummy line 70 is connected with the first power terminal, and the dummy line 70 is also used as the first power supply signal line Pvdd. The first power signal line Pvdd is the positive power line, the first constant voltage bus 80 is a positive power bus, and the dummy line 70 in the display area AA can provide the positive power signal for the pixel circuit. In some embodiments, with the dummy line 70 being reused as the first power signal line Pvdd, there is no need to provide a conventional first power signal line in the display area AA, which can save the space consumed by pixel circuits and increase the number of the pixel circuits. In other embodiments, with the dummy line 70 being reused as the first power signal line Pvdd, the dummy line 70 is arranged to be connected in parallel with the conventional first power signal line in the display area AA, which can reduce voltage drop in transmitting the first power signal, improve the uniformity of the power signal in the display area AA, and further improve the brightness uniformity.

In another embodiment, the constant voltage signal terminals 30h further include a second power terminal, and the dummy line 70 is connected with the second power terminal, and the dummy line 70 is reused as the second power supply signal line Pvee. The second power signal line Pvee is the negative power line, the first constant voltage bus 80 is a negative power bus, and the dummy line 70 in the display area AA can provide the negative power signal for the pixel circuit. In the conventional display panel, it is necessary to arrange the negative power bus around left and right frames and upper frame of the display area AA, which results in a large space consumed by the negative power bus in the non-display area NA. With a design of the embodiment of the disclosure, the negative power bus at the left and right frames and the upper frame of the display area AA can be removed, and the negative power bus is only arranged in the first non-display area NA1, which can reduce the voltage drop in transmitting negative power signals, improve uniformity of the negative power signals in the whole display area AA, and reduce a size of the frame and increase a screen-to-body ratio at the same time.

In another embodiment, the display panel further includes a reset signal line Ref, and the pixel circuit 021 includes a reset terminal connected with the reset signal line Ref. Referring to FIG. 15 it can be understood that the first electrode of the gate reset transistor T1 and the first electrode of the electrode reset transistor T2 are reset terminals of the pixel circuit 021. The constant voltage signal terminals 30h further include a reset signal terminal, and the dummy line 70 is connected with the reset signal terminal, and the dummy line 70 is also used as a reset signal line Ref, that is, the first constant voltage bus 80 is a reset bus, and the dummy line 70 in the display area AA can provide a reset signal for the pixel circuit. As shown in FIG. 13, the dummy line 70 forms an approximate grid-like structure in the whole display area AA, and with this arrangement, the uniformity of pattern density in the display area AA can be improved. In some embodiments, the virtual line 70 is connected with the reset signal, which can also reduce impedance of the whole reset signal line and improve in-plane uniformity of the reset signal, thereby improving the brightness uniformity in the display area AA.

It is illustrated in FIG. 15 that the gate reset transistor T1 and the electrode reset transistor T2 are connected with a same reset signal line Ref.

Figure 16:
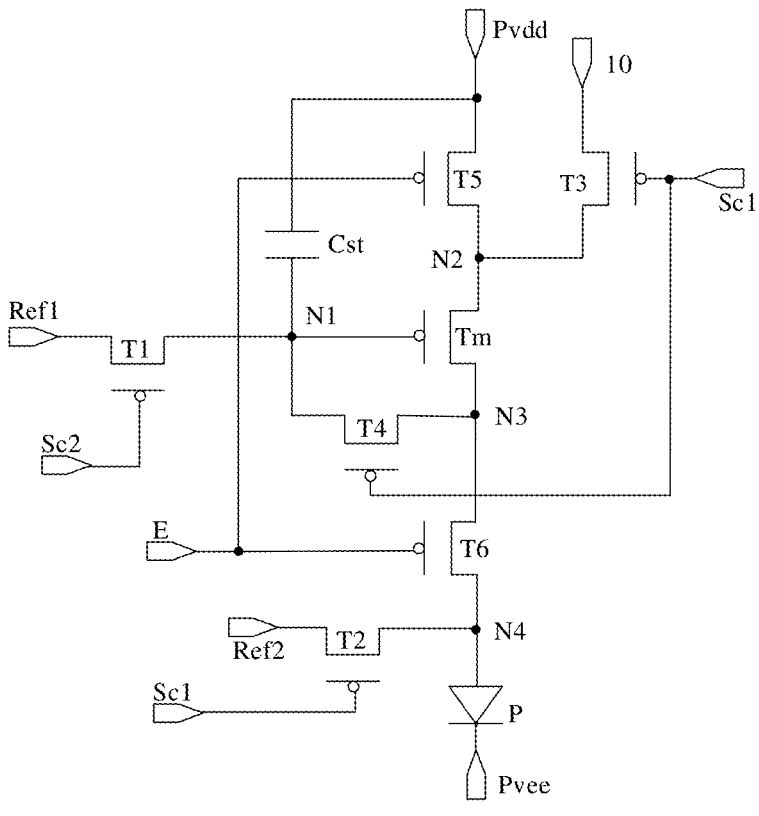
FIG. 16 is a schematic diagram of another pixel circuit according to an embodiment of the present disclosure.

In some embodiments, FIG. 16 is another schematic diagram of another pixel circuit according to an embodiment of the present disclosure. As shown in FIG. 16, the first electrode of the gate reset transistor T1 is connected with the first reset signal line Ref1, and the first electrode of the electrode reset transistor T2 is connected with the second reset signal line Ref2. The first reset signal line Ref1 provides the first reset signal and the second reset signal line Ref2 provides the second reset signal, and a voltage value of the first reset signal is different from that of the second reset signal. The gate of the gate reset transistor T1 is connected with the second scanning line Sc2, and the gate of the electrode reset transistor T2 is connected with the first scanning line Sc1.

In the embodiment of FIG. 16, the reset terminal includes a first reset terminal and a second reset terminal. The first electrode of the reset transistor T1 is the first reset terminal of the pixel circuit 021, and the first reset signal line Ref1 is connected with the first reset terminal. The first electrode of the reset transistor T2 is the second reset terminal of the pixel circuit 021, and the second reset signal line Ref2 is connected with the second reset terminal.

In an embodiment, the dummy line 70 is arranged to transmit the first reset signal, that is, the dummy line 70 is also used as the first reset signal line Ref1. In another embodiment, the dummy line 70 is arranged to transmit the second reset signal, that is, the dummy line 70 is also used as the second reset signal line Ref2.

In another embodiment, a part of dummy lines 70 are also used as the first reset signal line Ref1, and a remaining part of the dummy lines 70 are also used as the second reset signal line Ref2. With this arrangement, the part of the dummy lines 70 can be used to reduce voltage drop in transmitting the first reset signal, while the remaining part of the dummy lines 70 can be used to reduce voltage drop in transmitting the second reset signal. Thereby the uniformity of reset signals in the display area AA can be improved.

In an embodiment, the display panel includes a third reset signal line extending in the first direction x and a fourth reset signal line extending in the second direction y. The third reset signal line and the fourth reset signal line intersect with each other and are connected with each other at the intersecting position of the third reset signal line and the fourth reset signal line. The third reset signal line and the fourth reset signal line both transmit the first reset signal. With this arrangement, the third reset signal line and the fourth reset signal line intersect with each other to form a grid structure, which can reduce the voltage drop in transmitting the first reset signal. In the embodiment of the present disclosure, the part of the dummy lines 70 are used as the first reset signal line Ref1, which can further reduce the voltage drop in transmitting the first reset signal and improve in-plane transmission uniformity of the first reset signal. In the embodiment of the disclosure, the plurality of light-emitting elements P are arranged in columns of pixels in the first direction x in the display area AA, and optionally, the light-emitting elements P in two adjacent columns of pixels are connected with a same third reset signal line, so that it can be realized that the third reset signal line and the fourth reset signal line intersect with each other to form a grid-like structure, while a number of the third reset signal line can be reduced, thereby saving the wiring space in the display panel.

In an embodiment, the display panel further includes a fifth reset signal line extending in the first direction x and a sixth reset signal line extending in the second direction y. The fifth reset signal line and the sixth reset signal line intersect with each other and are connected with each other at the intersecting position of the fifth reset signal line and the sixth reset signal line. The fifth reset signal line and the sixth reset signal line both transmit the second reset signal. With this arrangement, the fifth reset signal line and the sixth reset signal line intersect with each other to form a grid structure, which can reduce the voltage drop in transmitting the second reset signal. In the embodiment of the present disclosure, part of the virtual lines 70 are used as the second reset signal line Ref2, which can further reduce the voltage drop in transmitting the second reset signal and improve in-plane transmission uniformity of the second reset signal. In the embodiment of the disclosure, the plurality of light-emitting elements P are arranged in columns of pixels in the first direction x in the display area AA, and optionally, the light-emitting elements P in two adjacent columns of pixels are connected with a same fifth reset signal line, so that it can be realized that the fifth reset signal line and the sixth reset signal line intersect with each other to form a grid-like structure, while a number of the fifth reset signal line can be reduced, thereby saving the wiring space in the display panel.

Figure 17:
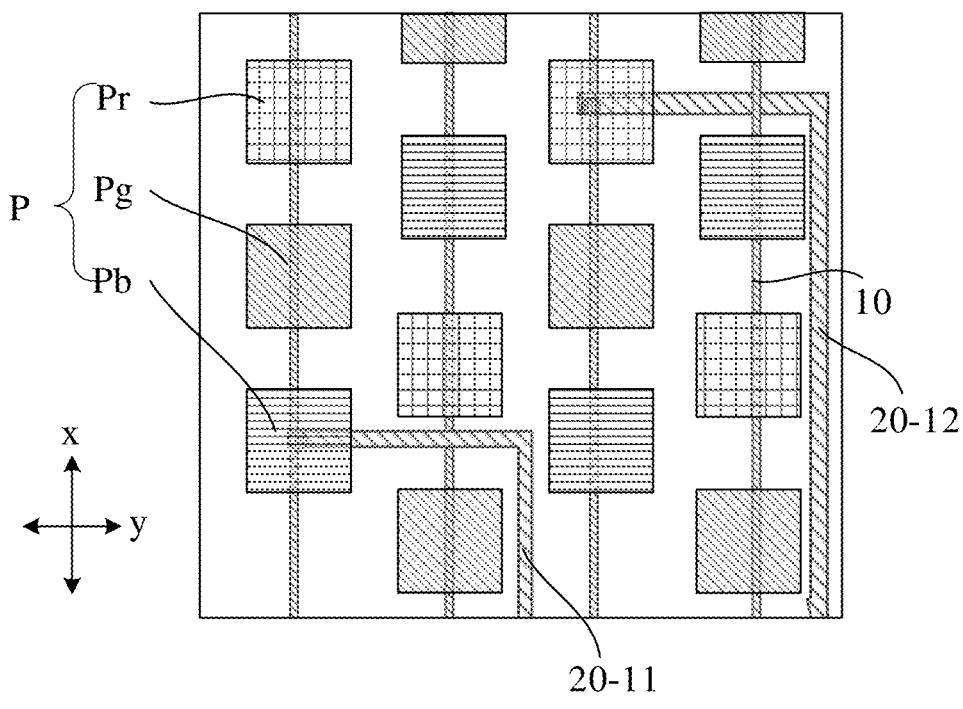
FIG. 17 is a partial schematic diagram of another display panel according to the embodiment of the present disclosure.

FIG. 17 is a partial schematic diagram of another display panel according to an embodiment of the present disclosure. As shown in FIG. 17, the light-emitting elements P include: a red light-emitting element Pr, a green light-emitting element Pg and a blue light-emitting element Pb. An arrangement of the light-emitting elements P in FIG. 17 is exemplary, but not a limitation on the present disclosure. As shown in FIG. 17, in the direction perpendicular to the plane of the substrate 010, connecting positions of the connecting lines 20-12 and the data lines 10 overlap with the red light-emitting element Pr, and connecting positions of the connecting lines 20-11 and the data lines 10 overlap with the blue light-emitting element Pb. That is, a via for connecting the connecting line with the data line 10 overlaps with the red light-emitting element Pr, or a via for connecting the connecting line with the data line 10 overlaps with the blue light-emitting element Pb. While the via for connecting the connecting line with the data line 10 does not overlap with the green light-emitting element Pg. In this embodiment, for designing a position where the connecting line 20 is connected with the data line 10 through the via, the position is not necessary to avoid the red light-emitting element Pr and the blue light-emitting element Pb, so that the wiring mode of the connecting line 20 can be relatively simplified. In some embodiments, the via for connecting the connecting line with the data line 10 is arranged not to be overlapped with the green light-emitting element Pg, which can avoid influence of the via on uniform light emission of the green light-emitting element Pg in all directions, and also can reduce influence on display color cast.

In some embodiments, as illustrated in the above-mentioned embodiment of FIG. 10, the second dummy line 72 intersects with the first segment X1 and the second dummy line 72 is broken at the intersecting position. It is arranged that in the direction perpendicular to the plane of the substrate 010, the breaking position of the second dummy line 72 does not overlap with the green light-emitting element Pg, while the breaking position of the second dummy line 72 may overlap with the red light-emitting element Pr or the blue light-emitting element Pb. With this arrangement, influence of the breaking position of the second dummy line 72 on the display color cast can be reduced.

In addition, overlapping of the breaking position of the third dummy line 73 with the light-emitting element P in the embodiment of FIG. 12 can be arranged with reference to overlapping of the breaking position of the second dummy line 72 with the light-emitting element P described above.

Figure 18:
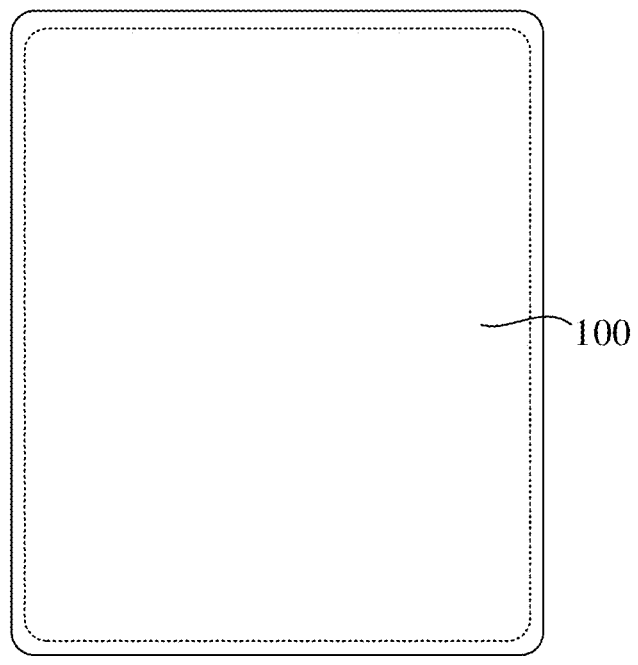
FIG. 18 is a schematic diagram of a display apparatus according to an embodiment of the present disclosure.

Based on a same inventive concept, a display apparatus is further provided in an embodiment of the present disclosure. FIG. 18 is a schematic diagram of a display apparatus according to an embodiment of the present disclosure. As shown in FIG. 18, the display apparatus includes a display panel 100 according to any of embodiments of the present disclosure. A structure of the display panel 100 has been explained in the above embodiment, which will not be repeatedly described here. The display apparatus according to an embodiment of the disclosure can be any element with a display function, such as a mobile phone, a tablet computer, a notebook computer, a television or the like.

The above are only preferred embodiments of the present disclosure, but not intended to limit the present disclosure. Any modifications, equivalents, improvements, etc. made within the spirit and principle of the present disclosure should be encompassed within the scope of the present disclosure.

Finally, it should be noted that the above embodiments are only intended to illustrate technical schemes of the present disclosure, but not to limit it. Although the present disclosure has been described in detail with reference to the foregoing embodiments, it should be understood by those skilled in the art that modifications can be made to the technical schemes described in the foregoing embodiments, or equivalent substitutions can be made to part or all of technical features thereof. These modifications or substitutions do not cause essence of corresponding technical schemes to depart from the spirit and scope of the technical schemes of the embodiments of this disclosure.

We claim:

1. A display panel comprising:
   a display area;
   a non-display area;
   a plurality of data lines and a plurality of connecting lines that are located in the display area; and
   a plurality of pads located in the non-display area,
   wherein the plurality of data lines each extend in a first direction, each connecting line of the plurality of connecting lines comprises a first end connected with a data line of the plurality of data lines, and a second end connected with a pad of the plurality of pads, and the display area comprises a first boundary close to the plurality of pads;
   wherein at least one connecting line of the plurality of connecting lines comprises a first segment, wherein the first segment extends from the first boundary to the display area in the first direction; and wherein the first segment has a length $D_1$ in the first direction, and the display area has a length $D_0$ in the first direction, where $D_1 > D_0/2$, wherein the display panel further comprises a substrate and a plurality of light-emitting elements located at a side of the substrate, the plurality of light-emitting elements comprising a red light-emitting element, a green light-emitting element, and a blue light-emitting element;

wherein, in a direction perpendicular to a plane of the substrate, a connecting part of a connecting line of the plurality of connecting lines and a data line of the plurality of data lines overlaps with the red light-emitting element or the blue light-emitting element, and does not overlap with the green light-emitting element.

2. The display panel according to claim 1, wherein the display area comprises a symmetry axis extending in the first direction; and wherein the plurality of connecting lines comprises at least two connecting lines located at a side of the symmetry axis, lengths of the first segments of the at least two connecting lines gradually increase from an edge of the display area to the symmetry axis in a second direction, and the second direction intersects with the first direction.

3. The display panel according to claim 2, wherein, at the side of the symmetry axis, a difference of lengths of two first segments adjacent of the at least two connecting lines from the edge of the display area to the symmetry axis in the second direction is a constant value.

4. The display panel according to claim 2, wherein, at the side of the symmetry axis:

the plurality of connecting lines comprises a first connecting line and a second connecting line, wherein a position where the first connecting line is connected with a data line of the plurality of data lines is a first position, and a position where the second connecting line is connected with a data of the plurality of data lines is a second position; and in the second direction, a distance between the first segment of the first connecting line and the symmetry axis is greater than a distance between the first segment of the second connecting line and the symmetry axis; and, in the first direction, a distance between the first position and the first boundary is smaller than a distance between the second position and the first boundary, and the second direction intersects with the first direction.

5. The display panel according to claim 2, wherein, at a side of the symmetry axis:

the plurality of connecting lines comprises a first connecting line and a second connecting line, wherein, in the second direction, a distance between the first segment of the first connecting line and the symmetry axis is greater than a distance between the first segment of the second connecting line and the symmetry axis;

the plurality of data lines comprises a first data line and a second data line, wherein, in the second direction, a distance between the first data line and the symmetry axis is greater than a distance between the second data line and the symmetry axis; and the first connecting line is connected with the first data line, and the second connecting line is connected with the second data line, and the second direction intersects with the first direction.

6. The display panel according to claim 1, wherein each connecting line of the plurality of connecting lines further comprises a second segment extending in a second direction intersecting with the first direction, wherein the second segment comprises an end connected with the first segment, and another end connected with a data line of the plurality of data lines.

7. The display panel according to claim 6, wherein each connecting line of the plurality of connecting lines further comprises a third segment extending in the first direction, wherein the second segment is connected with a data line of the plurality of data lines through the third segment;

the display area comprises a symmetry axis extending in the first direction; and at a side of the symmetry axis, the plurality of connecting lines comprises a first connecting line and a second connecting line, wherein, in the second direction, a distance between the first segment of the first connecting line and the symmetry axis is greater than a distance between the first segment of the second connecting line and the symmetry axis; the plurality of data lines comprises a third data line and a fourth data line, wherein, in the second direction, a distance between the third data line and the symmetry axis is greater than a distance between the fourth data line and the symmetry axis; and the first connecting line is connected with the fourth data line, and the second connecting line is connected with the third data line.

8. The display panel according to claim 1, further comprising: dummy lines located in the display area, wherein the dummy lines comprise first dummy lines; and two adjacent connecting lines of the plurality of connecting lines are spaced apart by at least one of the first dummy lines, and a wiring direction of a dummy line of the first dummy lines is the same as a wiring direction of a connecting line of the plurality of connecting lines.

9. The display panel according to claim 8, wherein the first dummy lines and the plurality of connecting lines are provided in a same layer and comprising a same material.

10. The display panel according to claim 8, wherein each first dummy line of the first dummy lines comprises a first dummy segment extending in the first direction, and the first dummy segment is located between two adjacent first segments of the first segments of the plurality of connecting lines.

11. The display panel according to claim 10, wherein each connecting line of the plurality of connecting lines further comprises a second segment extending in a second direction, wherein the second direction intersects with the first direction;

each first dummy line of the first dummy lines further comprises a second dummy segment extending in the second direction, and the second dummy segment is located between two adjacent second segments of the second segments of the at least two connecting lines; and the first dummy segment and the first segment are provided in a same layer and comprising a same material, the second dummy segment and the second segment are provided in a same layer and made of a same material, and the first dummy segment and the second dummy segment are located in different layers.

12. The display panel according to claim 10, wherein at least two adjacent first segments of the first segments are spaced apart by at least one data line of the plurality of data lines; and the display panel further comprises a substrate, wherein, in a direction perpendicular to a plane of the substrate, the first dummy segment and a data line of the plurality of data lines at least partially overlap.

13. The display panel according to claim 11, wherein the dummy lines further comprise second dummy lines each extending in the second direction;

at least one of the second dummy lines intersects with at least one of the first segments at a first position, and is broken at the first position; and at least one of the second dummy lines intersects with at least one of the first dummy lines at a second position, and is connected with the at least one of the first dummy lines at the second position.

14. The display panel according to claim 11, wherein the dummy lines comprise third dummy lines each extending in the first direction;

at least one of the third dummy lines intersects with at least one of the second segments at a first position, and is broken at the first position; and at least one third dummy line intersects with at least one of the first dummy lines at a second position, and is connected with the at least one of the first dummy lines at the second position.

15. The display panel according to claim 8, wherein the dummy lines comprise a fourth dummy line extending in the first direction, and the fourth dummy line does not intersect with the plurality of connecting lines.

16. The display panel according to claim 8, further comprising a constant voltage signal terminal configured to provide a constant voltage signal, wherein at least one of the dummy lines is connected with the constant voltage signal terminal.

17. The display panel according to claim 16, wherein the non-display area comprises a first non-display area, pads of the plurality of pads are located in the first non-display area; and the display panel further comprises a first constant voltage bus located in the first non-display area, wherein at least one of the dummy lines is connected with the constant voltage signal terminal through the first constant voltage bus.

18. The display panel according to claim 16, further comprising a substrate, and an array layer and an element layer that are located at a side of the substrate, wherein the array layer comprises a plurality of pixel circuits, and the element layer comprises a plurality of light-emitting elements, wherein each light-emitting element of the plurality of light-emitting elements comprises a first electrode, a light-emitting layer, and a second electrode which are stacked;

the first electrodes of the plurality of light-emitting elements are connected with first power signal lines through the plurality of pixel circuits, respectively, and the second electrodes of the plurality of light-emitting elements are connected with second power signal lines, respectively; and the constant voltage signal terminal comprises a first power terminal, and at least one of the dummy lines is connected with the first power terminal, and the dummy lines are reused as the first power signal lines;

or, the constant voltage signal terminal comprises a second power terminal, at least one of the dummy lines is connected with the second power terminal, and the dummy lines are reused as the second power supply signal lines, respectively.

19. The display panel according to claim 16, further comprising: a substrate, and an array layer and an element layer that are located at a side of the substrate, wherein the array layer comprises a plurality of pixel circuits, and the element layer comprises a plurality of light-emitting elements;

the display panel further comprises reset signal lines, and each pixel circuit of the plurality of pixel circuits comprises a reset terminal connected with one of the reset signal lines; and the constant voltage signal terminal comprises a reset signal terminal, at least one of the dummy lines is connected with the reset signal terminal, and the dummy lines are reused as the reset signal lines, respectively.

20. The display panel according to claim 19, wherein the reset signal lines comprise a first reset signal line and a second reset signal line, and the reset terminal comprises a first reset terminal and a second reset terminal, wherein the first reset signal line is connected with the first reset terminal, and the second reset signal line is connected with the second reset terminal;

each pixel circuit of the plurality of pixel circuits comprises a gate reset transistor, an electrode reset transistor, and a driving transistor, wherein the gate reset transistor is configured to reset a gate of the driving transistor, and the electrode reset transistor is configured to reset a light-emitting element of the plurality of light-emitting elements, a first electrode of the gate reset transistor is the first reset terminal, and a first electrode of the electrode reset transistor is the second reset terminal; and a dummy line of the dummy lines is reused as the first reset signal line, and another dummy line of the dummy lines is reused as the second reset signal line.

21. The display panel according to claim 1, wherein the display area comprises a first display area and two second display areas; in a second direction, the two second display areas are respectively located at two sides of the first display area, and the second direction intersects with the first direction; the display area comprises a symmetry axis extending in the first direction, and the symmetry axis is located in the first display area;

the plurality of data lines comprises a plurality of middle data lines and a plurality of edge data lines, wherein the plurality of middle data lines is located in the first display area, and the plurality of edge data lines is located in the two second display area; and the display panel comprises leads located in the non-display area, and middle data lines of the plurality of middle data lines are connected with the plurality of pads through the leads, respectively; and at least one connecting line of the plurality of connecting lines is located in one of the two second display areas, and connecting lines of the plurality of connecting lines are connected with the plurality of edge data lines, respectively.

22. A display apparatus, comprising a display panel comprising:

a display area;

a non-display area;

25

26 a plurality of data lines and a plurality of connecting lines that are located in the display area; and a plurality of pads located in the non-display area, wherein the plurality of data lines each extend in a first direction, each connecting line of the plurality of connecting lines comprises a first end connected with one of the plurality of data lines, and a second end connected with a pad of the plurality of pads, and the display area comprises a first boundary close to the plurality of pads;

wherein at least one connecting line of the plurality of connecting lines comprises a first segment, wherein the first segment extends from the first boundary to the display area in the first direction; and wherein the first segment has a length $D_1$ in the first direction, and the display area has a length $D_0$ in the first direction, where $D_1 > D_0/2$, wherein the display panel further comprises a substrate and a plurality of light-emitting elements located at a side of the substrate, the plurality of light-emitting elements comprising a red light-emitting element, a green light-emitting element, and a blue light-emitting element;

wherein, in a direction perpendicular to a plane of the substrate, a connecting part of a connecting line of the plurality of connecting lines and a data line of the plurality of data lines overlaps with the red light-emitting element or the blue light-emitting element, and does not overlap with the green light-emitting element.

* * * * *